United States Patent
Ueno et al.

(10) Patent No.: US 8,766,495 B2
(45) Date of Patent: Jul. 1, 2014

(54) POWER GENERATION ELEMENT AND POWER GENERATION APPARATUS INCLUDING THE POWER GENERATION ELEMENT

(71) Applicant: National University Corporation Kanazawa University, Ishikawa (JP)

(72) Inventors: Toshiyuki Ueno, Ishikawa (JP); Yoshio Ikehata, Ishikawa (JP); Sotoshi Yamada, Ishikawa (JP)

(73) Assignee: National University Corporation Kanazawa University, Ishikawa (JP)

( * ) Notice: Subject to any disclaimer, the term of this patent is extended or adjusted under 35 U.S.C. 154(b) by 0 days.

(21) Appl. No.: 13/716,553

(22) Filed: Dec. 17, 2012

(65) Prior Publication Data
US 2013/0140919 A1 Jun. 6, 2013

Related U.S. Application Data

(63) Continuation of application No. PCT/JP2011/003276, filed on Jun. 9, 2011.

(30) Foreign Application Priority Data

Jun. 18, 2010 (JP) ................................. 2010-139930

(51) Int. Cl.
*H01L 41/12* (2006.01)
(52) U.S. Cl.
USPC .......................................................... 310/26
(58) Field of Classification Search
USPC .................................................. 310/26, 339
See application file for complete search history.

(56) References Cited

U.S. PATENT DOCUMENTS

| | | | | |
|---|---|---|---|---|
| 3,753,058 | A * | 8/1973 | Edson | 318/118 |
| 4,845,450 | A * | 7/1989 | Porzio et al. | 335/215 |
| 5,982,054 | A * | 11/1999 | Rathore et al. | 310/26 |
| 2010/0127582 | A1* | 5/2010 | Nair et al. | 310/26 |

FOREIGN PATENT DOCUMENTS

| | | |
|---|---|---|
| JP | 7-222465 | 8/1995 |
| JP | 7-245970 | 9/1995 |
| JP | 8-130511 | 5/1996 |
| JP | 9-090065 | 4/1997 |
| JP | 2006-158113 | 6/2006 |

(Continued)

OTHER PUBLICATIONS

International Search Report issued Sep. 13, 2011 in International (PCT) Application No. PCT/JP2011/003276.

(Continued)

*Primary Examiner* — Tran Nguyen
*Assistant Examiner* — Leda Pham
(74) *Attorney, Agent, or Firm* — Wenderoth, Lind & Ponack, L.L.P.

(57) ABSTRACT

A power generation element includes: a first nnagnetostrictive rod made of a nnagnetostrictive material; a rigid rod made of a magnetic material and disposed in parallel with the first nnagnetostrictive rod, the magnetic material having rigidity and a shape that enable uniform application of a compression or tensile force to the first nnagnetostrictive rod; a first coil wound around the first nnagnetostrictive rod; and two connecting yokes, each of which is provided at one end of each of the first nnagnetostrictive rod and the rigid rod to connect the first nnagnetostrictive rod and the rigid rod; wherein the power generation element generates power through expansion or contraction of the first nnagnetostrictive rod due to vibration in a direction perpendicular to a longitudinal axis of the first nnagnetostrictive rod.

11 Claims, 26 Drawing Sheets

(56) References Cited

FOREIGN PATENT DOCUMENTS

| | | |
|---|---|---|
| JP | 2006-166694 | 6/2006 |
| JP | 2008-072862 | 3/2008 |
| JP | 2009-130988 | 6/2009 |
| JP | 2009-296734 | 12/2009 |

OTHER PUBLICATIONS

Hiroshi Hosaka, "Vibration Power-Generation Technologies for Wearable Information Devices", IEEJ Journal, vol. 126, No. 4, Apr. 2006, with English translation.

Y. Ubukata et al., "Basic Property of a Miniature Magnetostrictive Vibrator and a U-shaped Core of Fe—Ga Alloy (Galfenol) and its Application to Linear Actuators", Japan Mechanical Engineers Society [No. 10-252], No. 22, Collected Papers of the Symposium "Dynamics related to Electromagnetic Force", May 19-21, 2010, with English translation.

Extended European Search Report issued Feb. 26, 2014, in corresponding Application No. 11795381.0.

Jerzy Kaleta et al., "Power generating by high pulse mechanical stimulation of magnetic coupled NdFeB and Terfenol-D", Proc. of SPIE, vol. 7644, Mar. 19, 2010.

\* cited by examiner

Basic

Division into two

Division into three

Division into k

POWER GENERATION ELEMENT AND POWER GENERATION APPARATUS INCLUDING THE POWER GENERATION ELEMENT

This is a continuation application of PCT International Application No. PCT/JP2011/003276 filed on Jun. 9, 2011, designating the United States of America, which is based on and claims priority of Japanese Patent Application No. 2010-139930 filed on Jun. 18, 2010. The entire disclosures of the above-identified applications, including the specifications, drawings and claims are incorporated herein by reference in their entirety.

BACKGROUND OF THE INVENTION

The present invention relates to power generation elements using vibration and, in particular, to a power generation element using a magnetostrictive material.

Conventionally, techniques for generating power from ambient vibration have been actively developed. Among them, a technique for generating power from piezoelectric elements and a technique for generating power from a change in magnetic flux density of a permanent magnet are known.

Many of the methods for generating power using a piezoelectric element are performed by generating power by deforming the piezoelectric elements by external force in some way or other. Methods for deforming piezoelectric elements include a method for deforming a piezoelectric element by application of vibration to piezoelectric elements, a method for indirectly applying pressure such as wind pressure or sound pressure, a method for causing an object such as a weight to collide with piezoelectric elements, and a method for attaching piezoelectric elements to a deformed object (for example, refer to Japanese Unexamined Patent Application Publication No. 2006-166694). JP 2006-166694 discloses a sound power generation apparatus which generates power by a piezoelectric element using air pressure fluctuation caused by sound and a vibration power generation apparatus which generates power by piezoelectric elements using pressure fluctuation caused by vibration.

Moreover, a method for generating power using a change in magnetic flux of a permanent magnet is a method for generating power by a temporal change in interlinkage magnetic flux density of a coil caused by vibration of the permanent magnet, that is, a method for generating power using electromagnetic induction (for example, refer to Hiroshi Hosaka, "Wearable joho kiki no tame no shindo hassei gijutsu" (Vibration Power-Generation Technologies for Wearable Information Devices), Journal of the Institute of Electrical Engineers of Japan, vol. 126, no. 4, 2006 and Japanese Unexamined Patent Application Publication No. 2008-72862).

Hosaka discloses a power generation element which generates power through a change in magnetic flux density within a coil and generation of current by a permanent magnet vibrating within the coil in parallel with a magnetization direction.

JP 2008-72862 discloses a piezoelectric element including: a bias magnet which is magnetized in two poles; a magnetostrictive material which changes magnetic permeability through a reverse magnetostrictive effect by applying force from outside and changes a flow of magnetic flux; a compressing means which periodically compresses the magnetostrictive material in a direction having magnetic anisotropy; and a coil means which induces current by the periodically changing magnetic flux. In the power generation element, the magnetostrictive material, the coil, and the compressing means are disposed such that the periodically changing magnetic flux and the coil wound around the coil center form a linkage. In other words, this is a configuration which generates power with current which is generated in the coil by periodically compressing, in a longitudinal direction, the magnetostrictive material having magnetic anisotropy in a longitudinal direction.

The piezoelectric element disclosed in JP 2006-166694 has large piezoelectric longitudinal constant and high power generation efficiency of high piezoelectric vertical effect (when the direction of force and the direction of taking out voltage are the same). However, when power is generated using bending deformation through deforming a single-plate piezoelectric material, voltage is taken out in a direction perpendicular to a direction of force (piezoelectric horizontal effect), with the result that the power generation efficiency is low. Moreover, the piezoelectric material is a brittle material which is easily damaged by bending and impact. Therefore, there is a problem that an excessive load cannot be applied to the piezoelectric material and it is difficult to apply large bending to and have a large impact on the material for increasing power generation capacity. Moreover, the piezoelectric element has high impedance in low frequency since it is electrically capacitive load. There is a demerit that when a load having lower impedance than the piezoelectric element is connected to the piezoelectric element, voltage generated at the load is low, power obtained from power generation is low and power generation efficiency is low.

Moreover, in the method for generating power using a change in linkage magnetic flux density in the coil caused by the vibration of the permanent magnet as disclosed by Hosaka, it is necessary to cause a vibrator to vibrate at large amplitude and high frequency for increasing power generation capacity. When the size of the permanent magnet used as the vibrator is large, the mass of the vibrator is high while the resonance frequency of the vibrator is low. As a result, there is a problem that the power generation capacity is not increased.

Moreover, the method for generating power by periodically compressing the nnagnetostrictive material disclosed in JP 2008-72862 requires large force for compressing the nnagnetostrictive material in a longitudinal direction. Moreover, there is a problem that since the compression force is unevenly applied to the nnagnetostrictive material, power generation efficiency is low.

In light of the above mentioned problem, the present invention has an object to provide a power generation element which has strong resistance to bending and impact and has high power generation capacity, and an electronic device including the power generation element.

BRIEF SUMMARY OF THE INVENTION

In order to solve the above mentioned problem, a power generation element according to an aspect of the present invention includes: a first nnagnetostrictive rod made of a nnagnetostrictive material; a rigid rod made of a magnetic material and disposed in parallel with the first nnagnetostrictive rod, the magnetic material having rigidity and a shape that enable uniform application of compression force or tensile force to the first nnagnetostrictive rod; a first coil wound around the first nnagnetostrictive rod; and two connecting yokes each of which is provided at one end of each of the first nnagnetostrictive rod and the rigid rod to connect the first nnagnetostrictive rod and the rigid rod, wherein the power generation element generates power through expansion or contraction of the first nnagnetostrictive rod due to vibration in a direction perpendicular to an axis direction of the first nnagnetostrictive rod.

With this configuration, by vibration in a direction perpendicular to an axis direction of the first nnagnetostrictive material, the first nnagnetostrictive rod made of the nnagnetostrictive material bends and undergoes expansion and contraction in a direction parallel with an axis direction of the first nnagnetostrictive rod. With this, an inverse nnagnetostrictive effect occurs in which magnetic flux density changes in a direction parallel with the axis direction of the first nnagnetostrictive rod, and current is generated in the coil which is wound around the first nnagnetostrictive rod. In other words, with this configuration, it is possible to generate power by a temporal change in magnetic flux density using the inverse nnagnetostrictive effect. With this, it is possible to efficiently generate power with small force.

Moreover, since the nnagnetostrictive material having endurance to external force such as bending and impact is used for the nnagnetostrictive rod, it is possible to apply great bending to and have an impact on the power generation element and to increase power generation capacity.

Here, the rigid rod is a second nnagnetostrictive rod made of a nnagnetostrictive material, the power generation element further includes a second coil wound around the second nnagnetostrictive rod, and the power generation element generates power through expansion of one of the first nnagnetostrictive rod and the second nnagnetostrictive rod and contraction of the other due to vibration in a direction perpendicular to an axis direction of the first nnagnetostrictive rod and the second nnagnetostrictive rod.

With this configuration, it is possible to generate power by a temporal change in magnetic flux density using the inverse nnagnetostrictive effect, due to extension and contraction of two nnagnetostrictive rods that are made of the nnagnetostrictive material. Since the power generation element comprises a combination of the two nnagnetostrictive rods, one of the two nnagnetostrictive rods expands and the other contracts when vibration is applied to the power generation element in a direction perpendicular to the axis direction of the two nnagnetostrictive rods. With this, it is possible to efficiently generate power with small force.

Moreover, since the nnagnetostrictive material having endurance to external force such as bending and impact is used for the nnagnetostrictive rod, it is possible to apply great bending to and have an impact on the power generation element and to increase power generation capacity.

Here, an easy magnetization direction of the first nnagnetostrictive rod is in parallel with the axis direction of the first nnagnetostrictive rod.

Moreover, an easy magnetization direction of the first nnagnetostrictive rod and the second nnagnetostrictive rod is in parallel with an axis direction of the first nnagnetostrictive rod and the second nnagnetostrictive rod.

With this configuration, since an easy magnetization direction which is a direction easy to magnetize the nnagnetostrictive rod or a magnetization direction of the nnagnetostrictive rod is the same as a direction of expansion and contraction of the nnagnetostrictive rod, a change in magnetic flux density by the expansion and contraction of the nnagnetostrictive rod can be greater. With this, it is possible to generate power efficiently, and increase power generation capacity.

Here, it is favorable that the power generation element further includes a magnet having a back yoke.

With this configuration, since magnetization in the nnagnetostrictive rod is generated in bias by magnet, a material having no residual magnetization can be used as a nnagnetostrictive rod.

Here, it is favorable that one of the two connecting yokes is fixed and the other has a weight.

With this configuration, the fixation of one of the ends of the power generation element and the bending vibration of the weight provided at the other end make it possible for the power generation element to resonate and continuously generate power in a predetermined resonance frequency.

Here, the power generation element may resonate in a second resonant mode, and power can be efficiently generated even in a second resonance frequency that provides the second resonant mode.

Voltage generated in the power generation element is greater in proportion to the resonance frequency of the power generation element. With this configuration, since the power generation element vibrates in a second resonant mode having a resonance frequency that is higher than the first resonant mode generated generally in the power generation element, it is possible to obtain greater electric power.

Here, it is favorable that the weight has a shape that is longer in the axis direction of the nnagnetostrictive rod than in the direction perpendicular to the axis direction of the nnagnetostrictive rod.

With this configuration, it is possible to easily cause resonance of the second resonant mode.

Here, it is favorable that when the number of turns of the first coil is N, the first coil includes K coils connected in parallel and each having N/K turns.

Moreover, it is favorable that when the number of turns of each of the first coil and the second coil is N, the first coil and the second coil each include K coils connected in parallel and each having N/K turns.

With this configuration, it is possible to take out electric power which is $K^2$ times the electric power $V^2/R$ generated in the load resistance R of the coil.

Here, it is favorable that a plurality of power generation elements including the power generation element that are disposed in parallel, wherein the power generation elements are connected in series.

With this configuration, after the connecting yoke joining the magnetostrictive rods for the power generation elements can be used by an adjacent power generation element and the power generation elements are connected in series, power generation capacity can be increased. Specifically, the series connection of K power generation elements can help increase power generation capacity by K times. At the same time, since the parallel connection of K power generation elements can decrease resonance frequency to 1/K by arranging K power generation elements in parallel, the number of vibrations per unit time can be increased and power generation capacity can be increased. Moreover, since the overall structure of the power generation element is configured by spring shape having elasticity, the vibration of the power generation element can continue for a long time. With this, the number of vibrations and power generation capacity that are suitable for use environment can be easily adjusted.

Here, it is favorable that the magnetostrictive material has ductility.

With this configuration, the use of a magnetostrictive material having ductility can increase power generation capacity with magnetostrictive rods having strong resistance to bending and impact.

Here, it is favorable that the magnetostrictive material is an iron-gallium alloy.

With this configuration, by using, as the magnetostrictive material, an iron-gallium alloy such as Galfenol which has endurance to external force such as bending and impact and is easy for machine processing, power generation capacity can be increased.

Here, it is favorable that the magnetostrictive material is an iron-cobalt alloy.

With this configuration, by using, as the magnetostrictive material, the iron-cobalt alloy having high magnetostrictive effect such as permendur, power can be generated more efficiently.

Moreover, in order to overcome the above mentioned problem, the power generation apparatus having the power generation element according to an aspect of the present invention includes the power generation element having the above described features.

With this configuration, the present invention can provide the power generation apparatus including the power generation element having the above described features.

The present invention makes it possible to provide a power generation element having strong resistance to bending and impact and a power generation apparatus having sufficient power generation capacity.

BRIEF DESCRIPTION OF THE DRAWINGS

These and other objects, advantages and features of the invention will become apparent from the following description thereof taken in conjunction with the accompanying drawings that illustrate a specific embodiment of the present invention.

DETAILED DESCRIPTION OF THE INVENTION

Hereafter, the embodiments of the present invention will be described with reference to the drawings. It should be noted that the present invention will be described with reference to the embodiments and the attached drawings. However, these are examples and the present invention is not intended to be defined by only these.

Embodiment 1

Figure 1A:
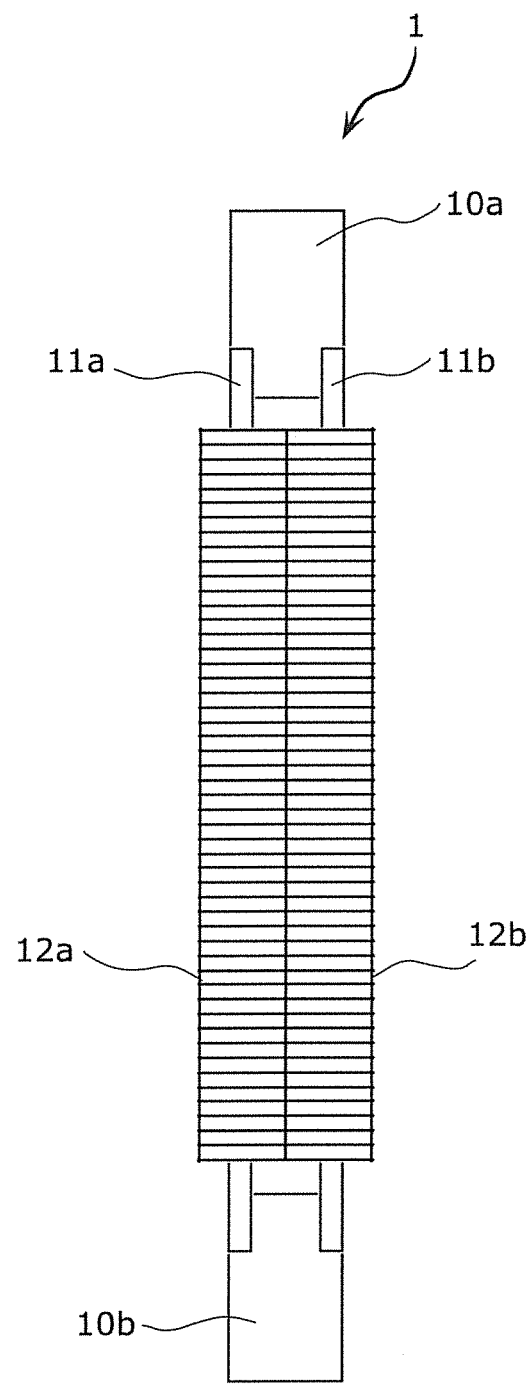
FIG. 1A is a top view of a power generation element according to Embodiment 1 of the present invention.
Figure 1B:
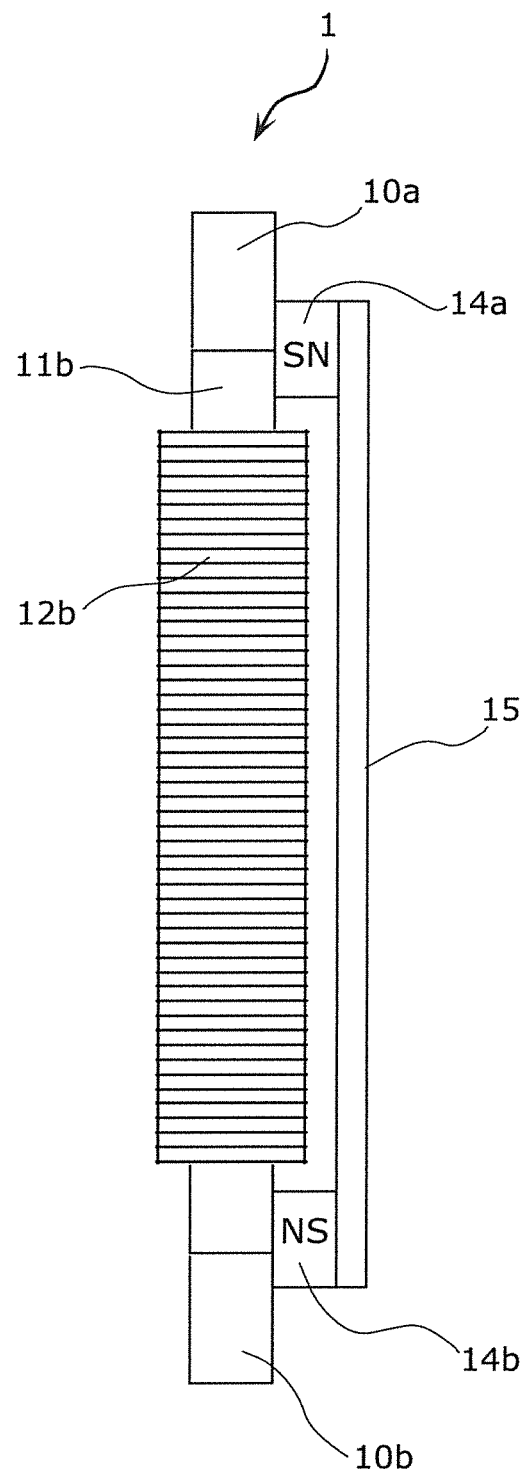
FIG. 1B is a side view of a power generation element according to Embodiment 1 of the present invention.

FIG. 1A is a top view of a power generation element according to an embodiment of the present invention, and FIG. 1B is a side view of a power generation element according to an embodiment of the present invention. As shown in FIGS. 1A and 1B, a power generation element 1 includes connecting yokes 10a and 10b, magnetostrictive rods 11a and 11b, coils 12a and 12b, permanent magnets 14a and 14b, and a back yoke 15.

Figure 2A:
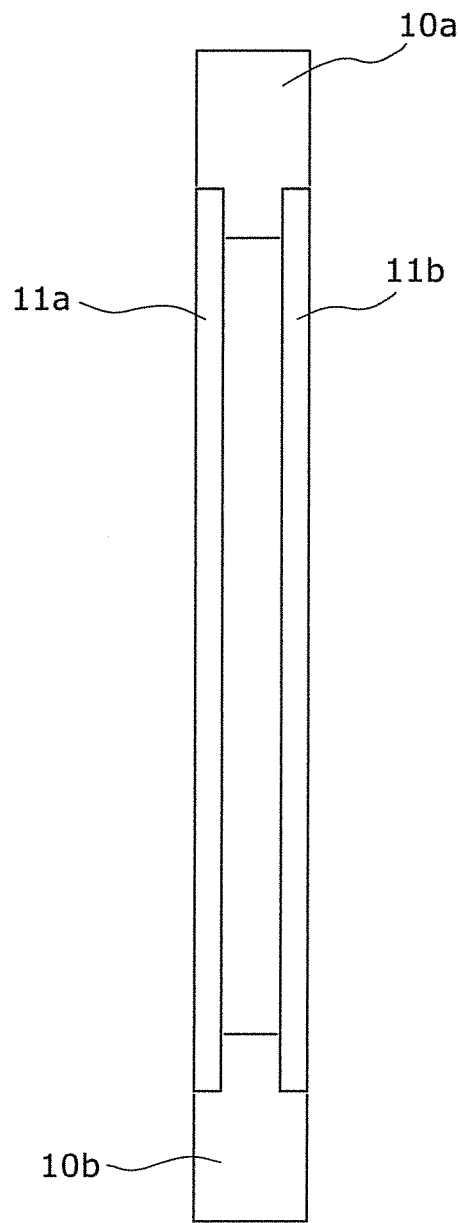
FIG. 2A is a top view showing arrangement positions of magnetostrictive rods and connecting yokes of the power generation element shown in FIG. 1A.
Figure 2B:
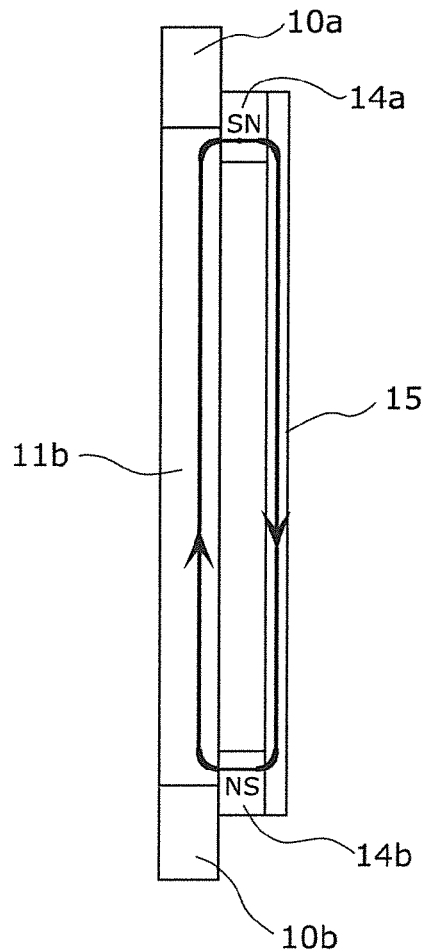
FIG. 2B is a side view showing arrangement positions of magnetostrictive rods and connecting yokes of the power generation element shown in FIG. 1B.

FIGS. 2A and 2B are each a schematic view showing the disposition locations of the magnetostrictive rod 11a and the magnetostrictive rod 11b, and the connecting yoke 10a and the connecting yoke 10b of the power generation element 1 shown in FIGS. 1A and 1B. FIGS. 2A and 2B correspond to FIGS. 1A and 1B, respectively.

The magnetostrictive rod 11a and the magnetostrictive rod 11b are each made of Galfenol that is an iron-gallium alloy, have ductility, and have a rod-shaped rectangular parallelepiped of 1 mm×0.5 mm×10 mm.

Moreover, as shown in FIG. 2A, the magnetostrictive rods 11a and 11b are disposed in parallel. One end of each of the magnetostrictive rods 11a and 11b is provided with the connecting yoke 10a for connection of the magnetostrictive rod 11a and the magnetostrictive rod 11a to the connecting yoke 10a. The other end of each of the magnetostrictive rods 11a and 11b is provided with the connecting yoke 10b for connection of the magnetostrictive rod 11a and the magnetostrictive rod 11b to the connecting yoke 10b. The connecting yokes 10a and 10b are formed with a magnetic material including Fe, for example, and are mechanically and magnetically connected to the magnetostrictive rods 11a and 11b.

The magnetostrictive rods 11a and 11b are connected to the connecting yokes 10a and 10b as follows, for example.

FIGS. 2C to 2J are each a diagram showing the method for joining the magnetostrictive rod 11a and the connecting yoke 10a, and the magnetostrictive rod 11b and the connecting yoke 10a. The magnetostrictive rods 11a and 11b and the connecting yoke 10a must be strongly joined with each other because they are used for vibration by the power generation element. However, the following method allows a joint between the magnetostrictive rod 11a and the connecting yoke 10a and a joint between the magnetostrictive rod 11b and the connecting yoke 10a to be solid enough to withstand vibration necessary for power generation.

Figure 2C:
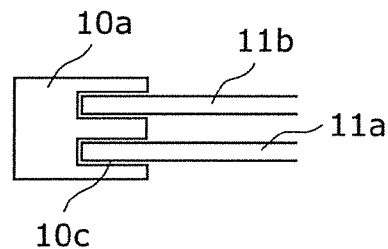
FIG. 2C is a top view of a method for joining magnetostrictive rods and a connecting yoke.
Figure 2D:
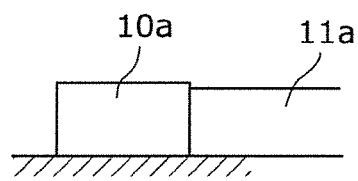
FIG. 2D is a side view of a method for joining magnetostrictive rods and a connecting yoke.

As shown in FIG. 2C, the connecting yoke 10a has two grooves for receiving the magnetostrictive rods 11a and 11b, and the magnetostrictive rods 11a and 11b are inserted into the respective grooves. At this time, there is a gap among the groove formed in the connecting yoke 10a, the magnetostrictive rods 11a and 11b, and the connecting yoke 10a. Generally, an adhesive is used for filling the gap. However, the only use of the adhesive does not ensure sufficient joint strength between the magnetostrictive rod 11a and the connecting yoke 10a, and between the magnetostrictive rod 11b and the connecting yoke 10a. Therefore, as shown in FIG. 2D, the height of the connecting yoke 10a is formed in advance to be larger than the heights of the magnetostrictive rods 11a and 11b.

Figure 2E:
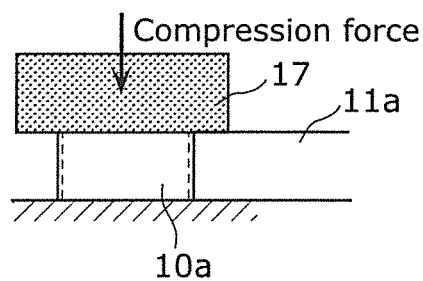
FIG. 2E is a side view of a method for joining magnetostrictive rods and a connecting yoke.
Figure 2F:
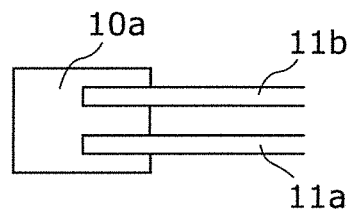
FIG. 2F is a top view of a method for joining magnetostrictive rods and a connecting yoke.
Figure 2G:
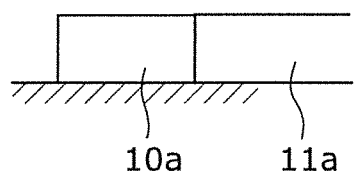
FIG. 2G is a side view of a method for joining magnetostrictive rods and a connecting yoke.

After the magnetostrictive rods 11a and 11b are inserted into the grooves formed in the connecting yoke 10a, as shown in FIG. 2E, the compression and crush of the connecting yoke 10a with a press 17 allows for filling the gap between the magnetostrictive rod 11a and the connecting yoke 10a and between the magnetostrictive rod 11b and the connecting yoke 10a due to the crushed portion of the connecting yoke 10a. The magnetostrictive rods 11a and 11b and the connecting yoke 10a are tightly attached to each other and a solid joint is formed between the magnetostrictive rod 11a and the connecting yoke 10a and between the magnetostrictive rod 11b and the connecting yoke 10a due to the crushed portion of the connecting yoke 10a. It should be noted that the compressed connecting yoke 10a, as shown in FIG. 2G, has the same height as the magnetostrictive rods 11a and 11b.

Figure 2H:
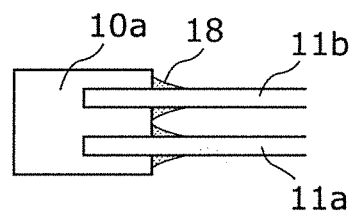
FIG. 2H is a top view of a method for joining magnetostrictive rods and a connecting yoke.

The portions of the connecting yoke 10a into which the magnetostrictive rods 11a and 11b are inserted are compressed by the crush of the connecting yoke 10a. It is believed that stress is concentrated on the base portions of the magnetostrictive rods 11a and 11b (the portion of the boundary between the portion of the connecting yoke 10a into which the magnetostrictive rods 11a and 11b are inserted and the portion of the connecting yoke 10a into which the magnetostrictive rods 11a and 11b are not inserted). Therefore, as shown in FIG. 2H, by reinforcing the adjacent area of the base portions of the magnetostrictive rods 11a and 11b with an adhesive 18 such as epoxy resin, the above described concentration of stress is decreased and the joint strength between the magnetostrictive rod 11a and the connecting yoke 10a and between the magnetostrictive rod 11b and the connecting yoke 10a can be further increased.

It should be noted that the joint between the magnetostrictive rods 11a and 11b and the connecting yoke 10a can be performed by a pinning method for forming a joint between the magnetostrictive rod 11a and the connecting yoke 10a and between the magnetostrictive rod 11b and the connecting yoke 10a through the penetration of a pin. Moreover, an injection method is possible in which the magnetostrictive rods 11a and 11b and the connecting yoke 10a are adhered tightly to each other by the crush of a crimped portion, after a concave portion is formed on the connecting yoke 10a, the magnetostrictive rods 11a and 11b are inserted into the concave portion, and the crimped portion having a shape of square column is inserted into between the magnetostrictive rods 11a and 11b and the crimped portion is compressed.

Moreover, the method can be applied to not only the joint between the magnetostrictive rods 11a and 11b and the connecting yoke 10a but also the joint between the magnetostrictive rods 11a and 11b and the connecting yoke 10b.

Figure 2I:
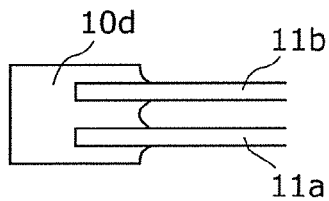
FIG. 2I is a top view of a method for joining magnetostrictive rods and a connecting yoke.

Moreover, the shape of the connecting yoke may be not only the shape shown in FIG. 2C but also the shape shown in FIG. 2I as an example. The connecting yoke 10a shown in FIG. 2C has its boundary, with and the magnetostrictive rods 11a and 11b, which is almost perpendicular to the magnetostrictive rods 11a and 11b. The connecting yoke 10d shown in FIG. 2I has its boundary, with the magnetostrictive rods 11a and 11b, which curves toward the magnetostrictive rods 11a and 11b. With this configuration, it is possible to reduce the concentration of stress at the base portion of the magnetostrictive rods 11a and 11b when the magnetostrictive rods 11a and 11b are bent by vibration.

Moreover, as shown in FIG. 2B, the back yoke 15 is provided with the lower surface side of the power generation element 1 The back yoke 15 is a configuration for applying bias magnetization to the magnetostrictive rods 11a and 11b.

The back yoke 15, as shown in FIG. 2B, includes the permanent magnet 14a provided on the side of the connecting yoke 10a and the permanent magnet 14b provided on the side of the connecting yoke 10b. The back yoke 15 is connected to the connecting yoke 10a and the connecting yoke 10b via the permanent magnet 14a and the permanent magnet 14b.

The permanent magnet 14a has a north pole on the surface side connected to the back yoke 15 and a south pole on the surface side connected to the connecting yoke 10a. Moreover, the permanent magnet 14b has a south pole on the surface side connected to the back yoke 15 and a north pole on the surface side connected to the connecting yoke 10b. The connecting yokes 10a and 10b, the magnetostrictive rods 11a and 11b, the permanent magnets 14a and 14b, and the back yoke 15 form a magnetic loop as shown by an arrow in FIG. 2B. With this, the magnetomotive force of the permanent magnets 14a and 14b causes the magnetostrictive rods 11a and 11b to generate bias magnetization. In other words, the magnetization direction of the magnetostrictive rods 11a and 11b and the easy magnetization direction in which the magnetization of the magnetostrictive rods 11a and 11b is easy to occur are set in a direction parallel with the axis direction of the magnetostrictive rods 11a and 11b. The value of the magnetization is, for example, 0.85 T (tesla) which is half of the saturation magnetic flux density of iron-gallium alloy.

It should be noted that the permanent magnet of the back yoke 15 is not limited to a configuration using the permanent magnets 14a and 14b shown in FIG. 2B. The following configuration is also possible.

Figure 2J:
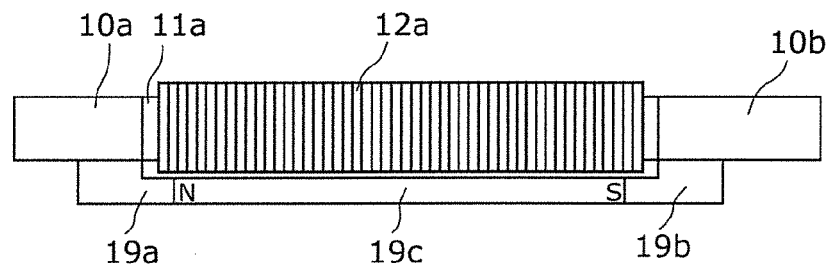
FIG. 2J is a side view showing an example of a configuration of a back yoke.

FIG. 2J is a side view showing an example of a configuration of a back yoke. As shown in FIG. 2J the back yoke of the power generation element comprises a connection unit 19a provided on the side of the connecting yoke 10a, a connection unit 19b provided on the side of the connecting yoke 10b, and a permanent magnet provided between the connection unit 19a and the connection unit 19b. In other words, the magnetostrictive rods 11a and 11b are not in contact with the permanent magnet 19c. The permanent magnet 19c is disposed in parallel with the magnetostrictive rods 11a and 11b. The connection units 19a and 19b are formed by a magnetic material including Fe as similarly to the connecting yokes 10a and 10b.

Since leakage magnetic flux occurs in a magnetic circuit, the magnetostrictive rods 11a and 11b, the connection unit 19a, the permanent magnet 19c, and the connection unit 19b form a magnetic loop even in the configuration shown in FIG. 2J. As a result, bias magnetization is applied to the magnetostrictive rods 11a and 11b.

It should be noted that the disposition of the permanent magnets in the above described back yoke is a mere example. The disposition is not limited to the above described configuration and another configuration is also possible. Moreover, the configuration is implemented by not only the permanent magnet but also by an electromagnet. As long as the configuration generates leakage magnetic flux in a magnetic circuit due to a magnetic field from outside the power generation element 1, the configuration in which a magnet is disposed outside the power generation element 1 and the configuration without magnet are acceptable.

Furthermore, as shown in FIGS. 1A and 1B, the magnetostrictive rods 11a and 11b form the coils 12a and 12b, respectively. The coils 12a and 12b are each composed of copper wire, for example, and each of the coils has about 300 turns. By changing the number of turns for each of the coils 12a and 12b, the value of voltage generated in the power generation element can be adjusted. A gap is provided between the magnetostrictive rod 11a and the coil 12a. Similarly, a gap is provided between the magnetostrictive rod 11b and the coil 12b. Moreover, the coils 12a and 12b are combined into a single entity by bridging the gap between them using resin. It should be noted that it is not necessary for the coils 12a and 12b to have a unified configuration. Moreover, the number of turns may be the same or different for each of the coils.

Figure 2K:
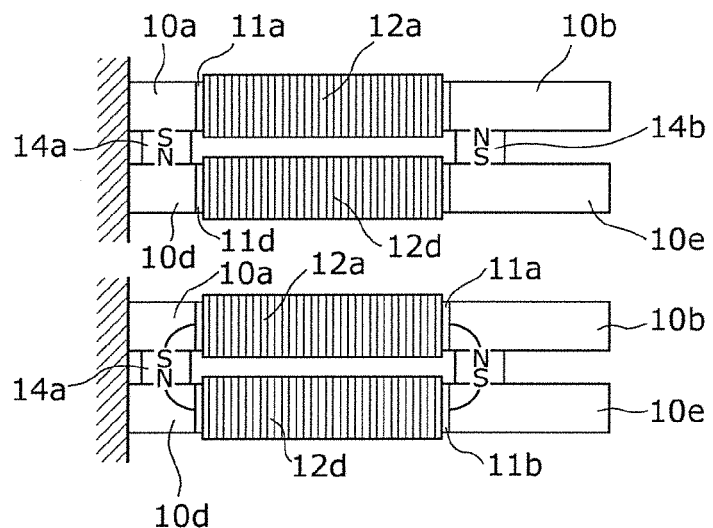
FIG. 2K is a side view showing a configuration of a power generation element in which a back yoke is replaced with magnetostrictive rods around which coils are wound.

Moreover, the power generation element 1, as shown in FIG. 2K, may be a configuration in which the back yoke 15 shown in FIG. 1B is replaced with a magnetostrictive rod around which coil is wound. FIG. 2K is a side view showing a configuration of a power generation element in which the back yoke is replaced with magnetostrictive rods around which coils are wound.

As shown in FIG. 2K, the coil 12d is wound around the magnetostrictive rod 11d which replaces the back yoke. At both ends of the magnetostrictive rod 11d, a movable yoke 10d and a movable yoke 10e are provided. The length of the movable yoke 10d is almost the same as the length of the connecting yoke 10a. Moreover, the length of the movable yoke 10b is almost the same as the length of the connecting yoke 10e. Moreover, the movable yoke 10d is connected to the connecting yoke 10a via the permanent magnet 14a. The movable yoke 10e is connected to the connecting yoke 10b via the permanent magnet 14b.

The permanent magnet 14a has a north pole on the surface side connected to the movable yoke 10d and a south pole on the surface side connected to the connecting yoke 10a. Moreover, the permanent magnet 14b has a south pole on the surface side connected to the movable yoke 10e and a north pole on the surface side connected to the connecting yoke 10b. The connecting yokes 10a and 10b, the magnetostrictive rods 11a and 11b, the permanent magnets 14a and 14b, and the movable yokes 10d and 10e form a magnetic loop as shown by the lower drawing in FIG. 2K.

With this, by a change in the magnetic flux within the coil 12d by vibration of the power generation element, not only the coil 12a but also the coil 12d can generate current and therefore power can be efficiently generated. Moreover, since in place of the back yoke, the magnetostrictive rod 11d around which coil 12d is wound is provided, the space can be effectively used and power can be efficiently generated.

Moreover, in FIG. 2K, the length of the movable yoke 10b is determined to be the same as the length of the movable yoke 10e. However, as shown in FIG. 2L, the length of the movable yoke 10b is different from the length of the movable yoke 10e.

Figure 2L:
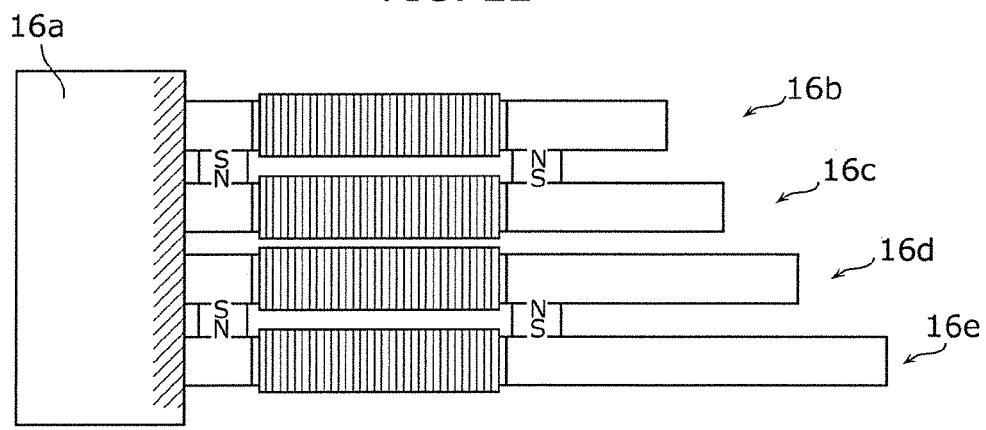
FIG. 2L is a side view showing a configuration of a power generation element in which a back yoke is replaced with magnetostrictive rods around which coils are wound.

FIG. 2L shows a configuration of a power generation element which includes the magnetostrictive rod 11d around which the coil 12d is wound in place of the back yoke, and in which a vibrator 16 is provided with the power generation elements 16b, 16c, 16d, and 16e having the lengths different from the lengths of the movable yokes 10b and 10e.

As shown in FIG. 2L, by determining the length of the movable yoke for each of the power generation elements 16b, 16c, 16d, and 16e to be different, the resonance frequency is different for each of the power generation elements 16b, 16c, 16d, and 16e. Therefore, with this configuration, the vibration of the vibrator 16a allows the power generation elements to simultaneously generate power in a wide frequency range.

It should be noted that it seems that in FIG. 2L, the power generation elements 16b and 16c are connected to the permanent magnets 14a and 14b, and the power generation elements 16d and 16e are connected to the permanent magnets 14a and 14b. However, since the absorption force of magnet is small and the absorption force does not influence a vibration direction, it is believed that it does not have an influence on the vibration of the power generation element.

Figure 3:
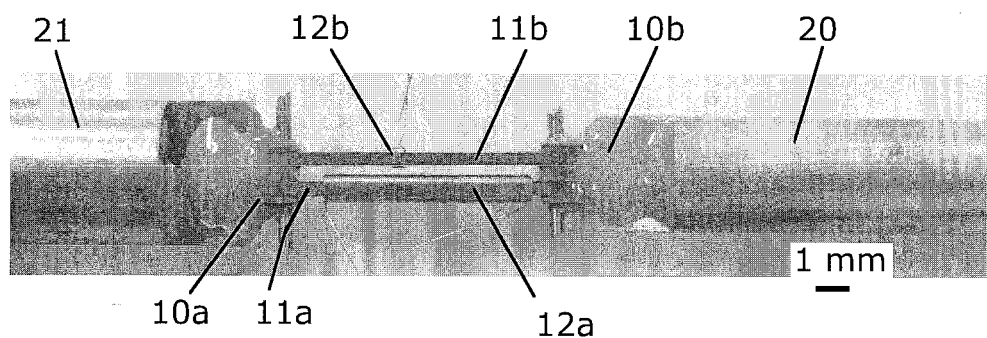
FIG. 3 is a picture showing an example of a power generation element shown in FIG. 1A.

FIG. 3 is a picture showing an example of the power generation element 1. The magnetostrictive rods 11a and 11b each have a rod-shaped rectangular parallelepiped (square column) with the cross section of 1 mm×0.5 mm and the axis direction length of about 10 mm. The connecting yoke 10a is fixed to a fixing member 21, and the connecting yoke 10b includes a weight 20. The weight 20 has a longer side in the axis direction of the magnetostrictive rods 11a and 11b. For example, the length of the weight 20 is almost the same as the lengths of the magnetostrictive rods 11a and 11b. With this configuration, the power generation element 1 performs bending vibration (resonance) with the connecting yoke 10a fixed to the fixing member 21 being the center, due to the vibration of the weight 20. By providing the weight 20, the vibration can be maintained by resonance. It should be noted that the shape of the weight 20 is not limited to a type of having a longer side in the axis direction of the magnetostrictive rods 11a and 11b. Other shapes are also possible. For example, part of the weight 20 formed longer in the axis direction may be folded in a U shape toward the fixing member 21, and the part of the weight 20 may have a configuration of being disposed in parallel with the magnetostrictive rods 11a and 11b. By forming the weight 20 in this way, the length of the weight 20 can be greater and the space for the weight 20 can be reduced.

Figure 4A:
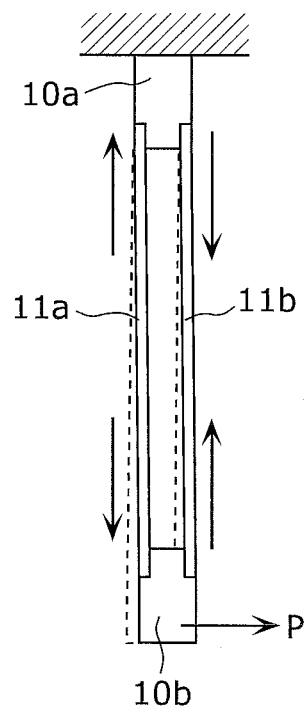
FIG. 4A is a top view showing a power generation operation of a power generation element and is a diagram showing an operation of a magnetostrictive rod.
Figure 4B:
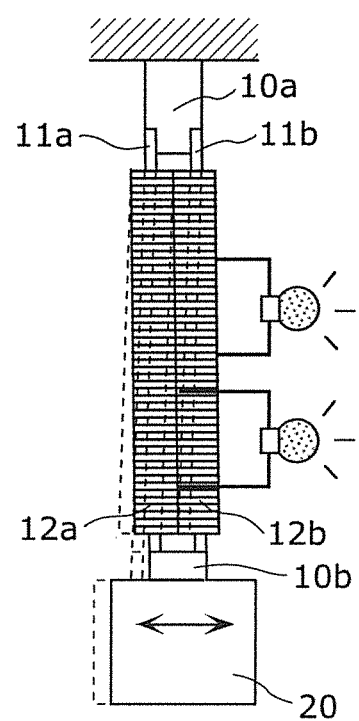
FIG. 4B is a top view showing a power generation operation of a power generation element and is a diagram showing a state in which a coil and a weight are disposed along with magnetostrictive rods.

FIG. 4A is a diagram showing the operations of the magnetostrictive rods 11a and 11b. FIG. 4B is a diagram showing a state where the coils 12a and 12b on the magnetostrictive rods 11a and 11b, and the weight 20 are disposed.

Inverse magnetostrictive effect occurs in the power generation element 1. The inverse magnetostrictive effect is an effect in which the magnetization is changed when stress is applied to the magnetized magnetostrictive material. By the change in the magnetization, induced voltage (or induced current) is produced in the coil and power is generated.

In detail, as shown in FIG. 4A, the connecting yoke 10a of the power generation element 1 has a configuration of being fixed to the fixing member and being regarded as a cantilever. By applying a predetermined bending force P to the connecting yoke 10b, the connecting yoke 10b of the power generation element 1 performs bending vibration. At this time, the direction of the bending force P is perpendicular to the axis direction of the magnetostrictive rods 11a and 11b. By the bending vibration of the connecting yoke 10b, the power generation element 1 is resonated. The resonance frequency at this time may be 300 Hz, for example. The resonance frequency may be from several dozen Hz to 1 kHz.

Moreover, after the bending force P is applied to the connecting yoke 10b, the magnetostrictive rods 11a and 11b are deformed by bending. More specifically, when the power generation element 1 receives the bending force P in a direction shown in FIG. 4A, the magnetostrictive rod 11a expands and the magnetostrictive rod 11b contracts. Moreover, when the connecting yoke 10b receives the bending force P in an opposite direction of the above described bending force P, the magnetostrictive rod 11a contracts and the magnetostrictive rod 11b expands. By the expansion and contraction of the magnetostrictive rods 11a and 11b, the magnetization of the magnetostrictive rods 11a and 11b increases or decrease due to the inverse magnetostrictive effect. With this, the magnetic flux density through the coils 12a and 12b is changed. Due to the temporal change in the magnetic flux density, as shown in FIG. 4B, induced voltage (or induced current) is produced in the coils 12a and 12b. Moreover, by the bending vibration of the connecting yoke 10b of the power generation element 1, the vibration can be maintained by resonance and power can be continuously generated.

It should be noted that the power generation element 1 with the above described configuration includes two magnetostrictive rods made of a magnetostrictive material. However, it is different from a power generation element with a so-called bimorph structure.

In the power generation element with a bimorph structure, generally, two magnetostrictive plates made of the magnetostrictive material are glued together and then coil is wound around the glued two magnetostrictive plates in one direction. In the power generation element with this configuration, even when one of the magnetostrictive plates expands and the other contracts due to vibration, the changes in magnetization for the two magnetostrictive plates are opposite in orientation to each other. Therefore, the changes in magnetic flux are offset with each other, with a result that little voltage is produced in the coil wound around the two magnetostrictive plates.

Conversely, since in the power generation element 1 with the above described configuration, the coil 12a is wound around the magnetostrictive rod 11a and the coil 12b is wound around the magnetostrictive rod 11b, voltage is produced in each of the coils 12a and 12b by and the change in magnetic flux, at each of the coils 12a and 12b, caused by the expansion and contraction of the magnetostrictive rods 11a and 11b. Moreover, since the magnetostrictive rods 11a and 11b are connected in parallel by the connecting yokes 10a and 10b, a configuration is formed such that when one of the magnetostrictive rods 11a and 11b expands, the other contracts without fail. At this time, around the center in parallel with the axis direction of the magnetostrictive rods 11a and 11b, the distribution of stress is almost uniform. Therefore, compared with the so-called power generation element with the bimorph structure, the power generation element can definitely have larger power generation capacity.

Figure 5:
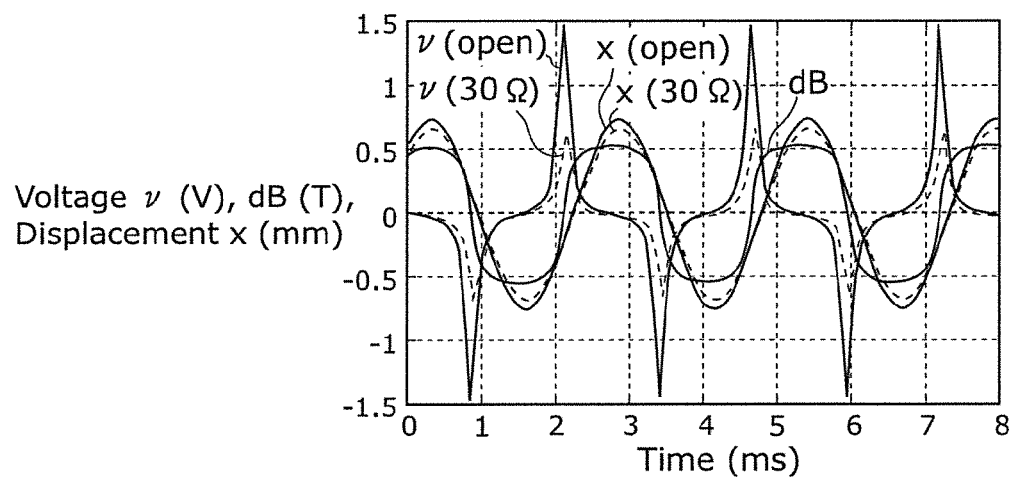
FIG. 5 is a diagram showing, in voltage, power generation capacity of the power generation element shown in FIG. 1A.

Here, the power generation capacity of the power generation element 1 in generating electricity will be described. FIG. 5 is a diagram showing, in voltage, power generation capacity of the power generation element 1 according to the present embodiment.

FIG. 5 shows displacement of a mover, generated voltage, and temporal response of the change in magnetic flux density when forced vibration is applied to an element at the first bending resonance frequency of 393 Hz. Here, FIG. 5 shows the generated voltage, the change in magnetic flux density, and the amplitude of the mover generated by the vibration of the mover, when load is not connected (open) or when load of 30Ω is connected.

In FIG. 5, the magnetic flux density through the coils 12a and 12b corresponding to the periodical change of the weight 20 is periodically changed and voltage is produced. In FIG. 5, when the magnetostrictive plate bends according to positive and negative displacement and the internal magnetic flux density changes between positive and negative, voltage is produced in proportion to the temporal distribution of the magnetic flux density. The change in magnetic flux density is, for example, plus or minus 0.5 T, and the maximum voltage generated at this time is plus or minus 1.5 V (open), for example. Moreover, when the load of 30Ω is connected, the maximum voltage decreases to 0.6 V, but the maximum electric power of 12 mW can be obtained as instantaneous electric power.

Moreover, in FIG. 5, when the load of 30Ω is connected, the amplitude of the mover decreases. This indicates that part of the mechanical energy is converted into electrical energy.

It should be noted that generally, the generated voltage can be calculated by the following Expression 1.
[Math. 1]

$$V = NAB 2\pi f \cos 2\pi f t = 0.39 \cos 2\pi f t \quad \text{(Expression 1)}$$

Here, V denotes the generated voltage, N denotes the number of turns of coil, A denotes the cross sectional area of the rod, B denotes the magnetic flux density through the coil, and f denotes resonance frequency of bending vibration.

Figure 6:
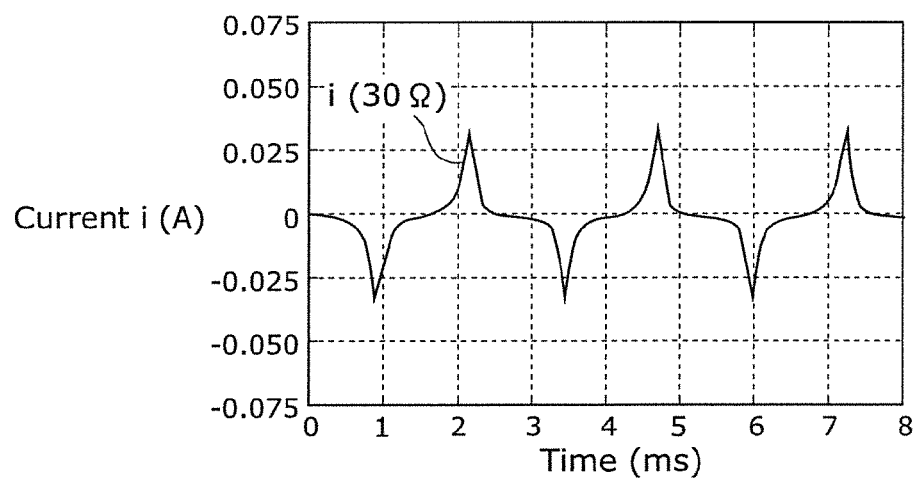
FIG. 6 is a diagram showing, in current, power generation capacity of the power generation element shown in FIG. 1A.

Moreover, FIG. 6 is a diagram showing, in current, power generation capacity of the power generation element 1 according to the present embodiment. FIG. 6 also shows induced current obtained when the load of 30Ω is connected. From the obtained current value, power generation capacity W is calculated by Expression 2. Here, T denotes a cycle of vibration. The power generation capacity W obtains a value of W=2 mW. It should be noted that load resistance R is determined as R=20Ω.

(Expression 2)

$$W = \frac{1}{T} \int_0^T I^2 R \, dt \quad \text{[Math. 2]}$$

By changing the cross sectional area A, the magnetic flux density B, the resonance frequency f, the number of turns of coil N, it is possible for power generation capacity of greater than or equal to 1 mW to be obtained, for example.

Figure 7:
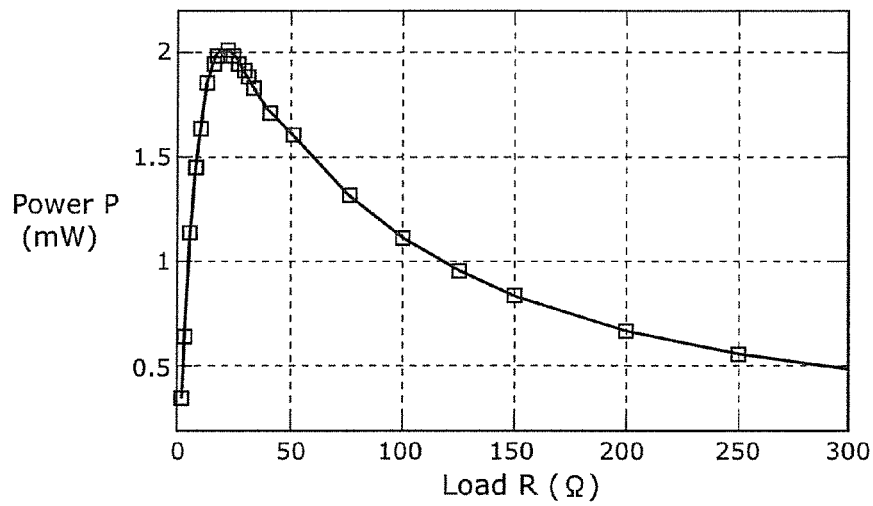
FIG. 7 is a diagram showing average generated power of the power generation element shown in FIG. 1A.

Next, the average generated power P and power density in power generation by the power generation element 1 will be described. FIG. 7 is a diagram showing the average generated power P with respect to the load resistance R in the power generation element 1 shown in FIG. 1A.

The average generated power P is calculated by the following Expression 3.

(Expression 3)

$$P = \frac{1}{T} \int_0^T \frac{v^2}{R} \, dt \quad \text{[Math. 3]}$$

Here, T denotes a cycle of vibration. The average generated power P is calculated by measurement of the instantaneous voltage v of the load resistance R.

In FIG. 7, it is found that the maximum electric power of 2.0 mW can be taken out under a matching condition where the load resistance R almost equal to the resistance of the coil is connected. The volume density of the generated power (power density) in this case is greater than or equal to 10 mW/cm$^3$. It should be noted that the power density is calculated based on the volume including the volume of the coils and yokes of the power generation element 1.

The above described power density value shows that the power generation element 1 using a magnetostrictive material according to the present embodiment can obtain power generation capacity 10 times or larger than power generation using piezoelectric element (1 mW/cm$^3$) or power generation using electret. In other words, the power generation element 1 can realize miniaturization of the element.

Figure 8A:
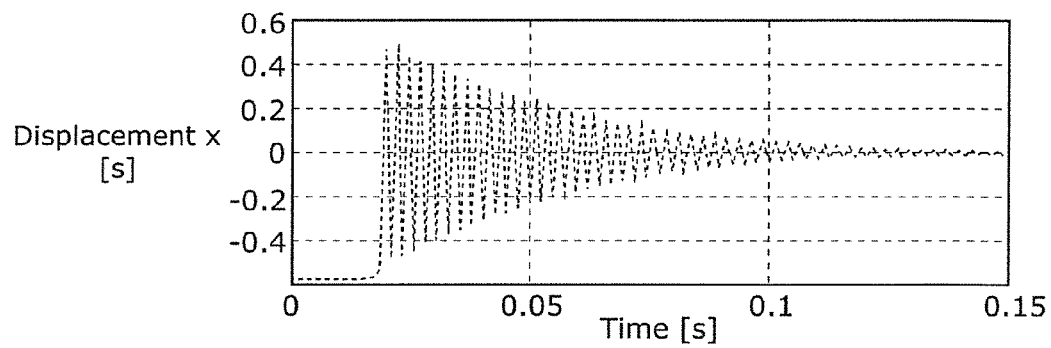
FIG. 8A is a diagram showing displacement of the power generation element shown in FIG. 1A.
Figure 8B:
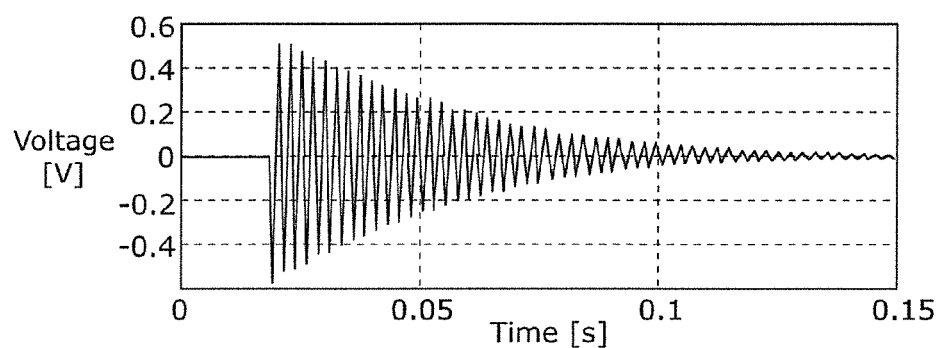
FIG. 8B is a diagram showing generated voltage of the power generation element shown in FIG. 1A.

Next, the energy conversion efficiency η of the power generation element 1 will be described. The energy conversion efficiency refers to the output mechanical energy with respect to the input mechanical energy. FIG. 8A is a diagram showing displacement of the power generation element shown in FIG. 1A. FIG. 8B is a diagram showing generated voltage of the power generation element shown in FIG. 1A.

The energy conversion efficiency η is calculated based on the input mechanical energy $W_i$ and the output electrical energy $W_o$ by the following Expression 4.

(Expression 4)

$$\eta = \frac{W_o}{W_i} = \int \frac{v^2}{R} dt \Big/ \frac{1}{2} F_0 X_0 \quad \text{[Math. 4]}$$

Here, the input mechanical energy $W_i$ is an initial elastic energy provided for excitation, and obtained from an initial displacement $X_0$ and force $F_0$. The output electrical energy $W_o$ is a temporal integration of Joule loss of the load resistance R. Moreover, the load resistance R is determined to be 30Ω. The displacement and generated voltage shown in FIGS. 8A and 8B is the displacement of the position of the weight 20 and the generated voltage when a 50-gram weight is hung with a string at the position of the weight 20 of the power generation element 1 and then the string is cut off and free vibration is started.

As shown in FIG. 8A, the displacement of the weight 20 reaches a peak at the start of vibration (around Time=0.02 s in FIG. 8A) and then decreases. As shown in FIG. 8B, the generated voltage reaches a peak value of 0.5 V at the start of vibration (around Time=0.02 s in FIG. 8B) and then is attenuated as similarly to the displacement shown in FIG. 8A (attenuation coefficient 0.081). According to FIG. 8B, the output electrical energy $W_o$ is $1.2 \times 10^{-5}$ J. According to FIG. 8A, the input mechanical energy $W_i$ is $8.9 \times 10^{-5}$ J. With the values, the energy conversion efficiency η is 0.14 (14%). In other words, according to FIGS. 8A and 8B, one time of free vibration by the cutoff of the 50-gram weight can generate peak electric power of 8.3 mW and average electric power of 0.12 mW ($1.2 \times 10^{-5}$ J/0.1 s).

Figure 9:
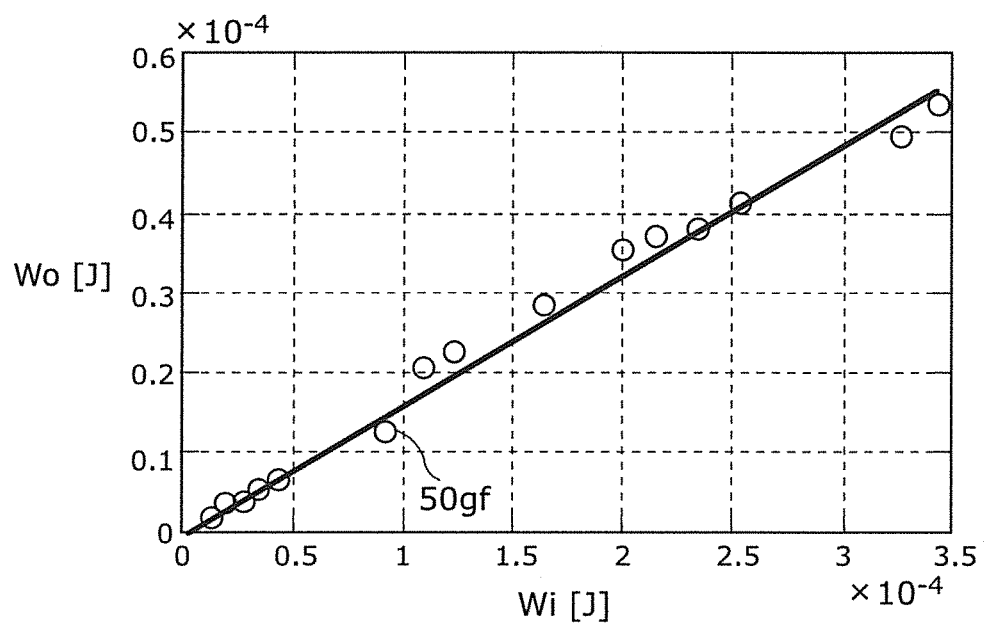
FIG. 9 is a diagram showing a relationship between input workload and output electrical energy of the power generation element shown in FIG. 1A.

Moreover, FIG. 9 is a diagram showing a relationship between the input workload (input mechanical energy) $W_i$ and the output electrical energy $W_o$ of the power generation element when the excitation condition is changed by the weight.

As shown in FIG. 9, the relationship between the input workload (input mechanical energy) $W_i$ and the output electrical energy $W_o$ is almost linear. Moreover, the energy conversion efficiency η is calculated to be 15%. Given that in the resistance of the coil, the Joule loss is generated almost equal to the resistance of the coil, the energy conversion efficiency is believed to be greater than or equal to 30%.

Figure 10A:
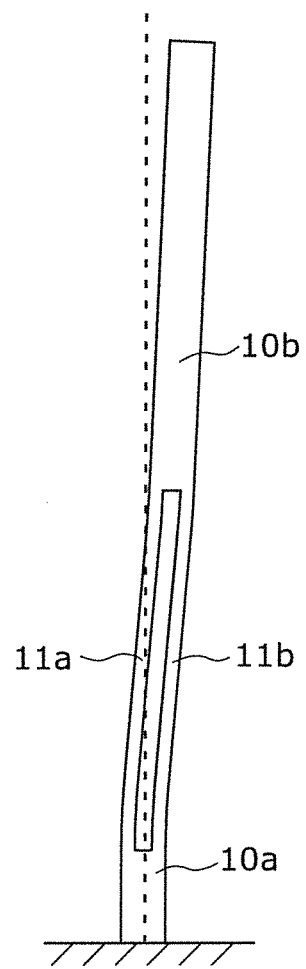
FIG. 10A is a diagram showing a change, in a first resonant mode, in shape of the power generation element shown in FIG. 1A.
Figure 10B:
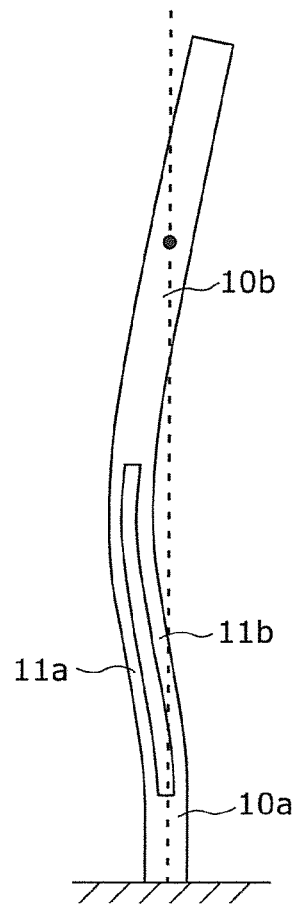
FIG. 10B is a diagram showing a change, in a second resonant mode, in shape of the power generation element shown in FIG. 1B.

Here, the resonant mode and shape changes when the power generation element 1 is vibrating will be described. FIG. 10A is a diagram showing a change in shape of the power generation element in the first resonant mode shown in FIG. 1A. FIG. 10B is a diagram showing a change in shape of the power generation element in the second resonant mode shown in FIG. 1A.

The power generation element 1 in FIG. 10A is set as a cantilever. In other words, in the power generation element 1, the connecting yoke 10a, that is, the one of the connecting yokes, is fixed and the connecting yoke 10b, that is, the other yoke, is not fixed. It should be noted that the connecting yoke 10b that is not fixed is called a movable unit. The power generation element 1 having a configuration of such a cantilever can efficiently generate power in a resonant state. The number of resonant vibration modes of the power generation element 1 is unlimited. However, resonance in the first resonant mode shown in FIG. 10A is generally frequent.

In the resonance of the first resonant mode, the power generation element 1 as shown in FIG. 10A is deformed to bend in one direction as the whole of the cantilever. At this time, the magnetostrictive rod 11a expands and the magnetostrictive rod 11b contracts. With this, the power generation element 1 can generate power according to the deformation amount of the magnetostrictive rod.

Moreover, power generation by the power generation element 1 can be performed in the second resonant mode. In other words, the power generation element 1 set as a cantilever resonates in a high-order resonant mode having a resonance frequency that is higher than the first resonant mode, due to the shape of the power generation element 1 and the frequency of vibration to be provided. For example, in the second resonant mode having resonance frequency that is four times higher than the resonance frequency in the first resonant mode, the power generation element 1 shows deformation shown in FIG. 10B.

As shown in FIG. 10B, the power generation element 1 in the second resonant mode can create a nodal point as shown in FIG. 10B when the whole is viewed as cantilever. At this time, the parallel beam portions of the cantilever, that is, the magnetostrictive rods 11a and 11b, and the movable unit (the connecting yoke 10b on the side that is not fixed in the power generation element 1) is deformed to bend in one direction as a whole. At this time, the magnetostrictive rod 11a expands and the magnetostrictive rod 11b contracts. With this, the power generation element 1 can generate power according to the deformation amount of the magnetostrictive rods 11a and 11b.

Since the voltage produced in the power generation element 1 is greater in proportion to the resonance frequency of the power generation element 1, the power generation element 1 in the second resonant mode can generate electric power that is greater than the power generation element in the first resonant mode because the resonance frequency in the second resonant mode is higher than that in the first resonant mode.

In order to easily cause resonance by the power generation element 1 in the second resonant mode, it is effective to produce a configuration in which vibration nodes of the magnetostrictive rods 11a and 11b of the power generation element 1 are easy to form by extending the length of the movable unit in the power generation element 1 and softening part of the connection unit and part of the movable unit after setting a portion connecting the movable unit and the parallel beams.

Moreover, by introducing a configuration in which power generation elements 1 having different resonant frequencies are arranged, a configuration to resonate in a plurality of kinds of frequencies is possible. With this configuration, when the frequencies of vibration applied to the power generation element 1 are different, it is possible to generate power evenly.

The magnetostrictive material for the magnetostrictive rods 11a and 11b may be not only Galfenol that is an iron-gallium alloy but also other materials. When Galfenol is used, the change in internal magnetization of Galfenol by the application of stress is made until saturation magnetic flux density reaches about 1 T, with a result that power generation capacity can be increased for the power generation element 1.

As a magnetostrictive material other than Galfenol, for example, permendur that is an iron-cobalt alloy and others are acceptable. Moreover, not only a material which is in a crystal condition but also a material which is in an amorphous condition is acceptable. Furthermore, in order to magnify the change in magnetization with respect to tensile stress, a magnetostrictive material to which compression stress is added by stress anneal process in advance can be used.

It should be noted that the above described power generation element 1 is a power generation element in which the magnetostrictive rods 11a and 11b are both made of the magnetostrictive material. However, one of the magnetostrictive rods 11a and 11b, for example, the magnetostrictive material 11b, may be the magnetostrictive material 11b composed of a material having almost the same rigidity as the magnetostrictive material or a material having rigidity greater than or equal to the magnetostrictive material. In this case, since the coil 12b does not have to be wound around the rigid rod 11b, it is possible for the number of turns for the coil 12a to be increased and for the power generation element 1 to implement in a simple configuration.

Moreover, the direction of the bending force P applied to the connecting yoke 10b may be various as long as the direction is perpendicular to the axis direction of the magnetostrictive rods 11a and 11b, and one of the magnetostrictive rods 11a and 11b expands and the other contracts.

Moreover, the shapes of the magnetostrictive rods 11a and 11b are not limited to the rod-shaped rectangular parallelepiped. For example, the shapes of a rod-shaped column, a plate, a continuous thin ribbon, and others are possible.

Embodiment 2

Next, Embodiment 2 according to an aspect of the present invention will be described. In Embodiment 1, the power generation element comprises two magnetostrictive rods. In the present embodiment, the difference from Embodiment 1 is that the power generation element is composed of one magnetostrictive rod and one connecting yoke.

Figure 11A:
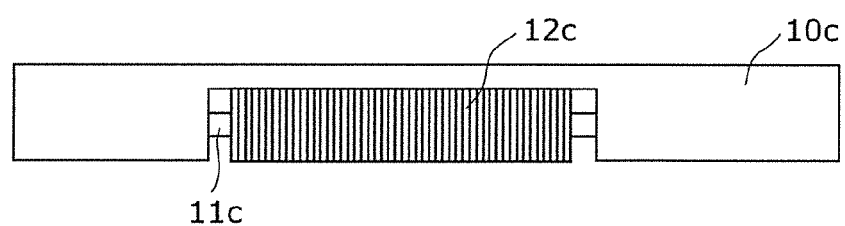
FIG. 11A is a side view of a power generation element according to Embodiment 2.
Figure 11B:
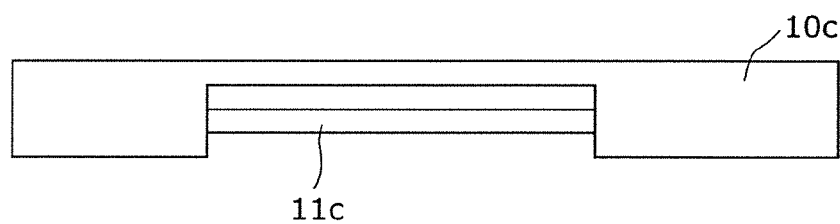
FIG. 11B is a side view showing the arrangement positions of a magnetostrictive rod and a connecting yoke of the power generation element shown in FIG. 11A.

FIG. 11A is a side view of the power generation element according to the present embodiment. FIG. 11B is a side view showing the arrangement positions of a magnetostrictive rod and a connecting yoke of the power generation element shown in FIG. 11A.

As shown in FIG. 11A, the power generation element according to the present embodiment includes a magnetostrictive rod 11c, a connecting yoke 10c, and a coil 12c. It should be noted that the magnetostrictive rod 11c and the coil 12c correspond to the first magnetostrictive rod and the first coil, respectively.

As similarly to the magnetostrictive rods 11a and 11b shown in Embodiment 1, the magnetostrictive rod 11c is composed of Galfenol that is an iron-gallium alloy (Young's modulus of 70 GPa), has ductility, and has a rod-shaped rectangular parallelepiped of size of 1 mm×0.5 mm×10 mm. The connecting yoke 10c is formed with a magnetic material having rigidity and a shape for uniform application of stress (compression force or tensile force) to the magnetostrictive rod 11c. The rigidity for uniform application of compression force or tensile force is, for example, a magnetic material having almost the same rigidity as the magnetostrictive material 11c. The shape for uniform application of compression force or tensile force is, for example, a magnetic material having almost the same shape as the magnetostrictive rod 11c. As such a material, for example, there is stainless steel such as SUS430 (Young's modulus of 210 GPa) that is a magnetic material including Fe.

The connecting yoke 10c, as shown in FIG. 11B, partially has a concave portion. One of the ends of the magnetostrictive rod 11 and the other end are mechanically and magnetically connected to the sidewalls of the concave portion. Therefore, in the concave portion, the magnetostrictive rod 11c and the connecting yoke 10c are disposed in parallel. In other words, a portion of the connecting yoke 10c which is disposed in parallel with the magnetostrictive rod 11c corresponds to a rigid rod in the present invention. Moreover, a portion other than the connecting yoke 10c which is disposed in parallel with the magnetostrictive rod 11c corresponds to two connecting yokes in the present invention. With this configuration, when the power generation element 1 vibrates in a direction perpendicular to the axis direction of the magnetostrictive rod 11c, the magnetostrictive rod 11c expands or contracts. With this, a change in magnetic flux occurs in the magnetostrictive rod 11c.

Moreover, as shown in FIG. 11A, the coil 12c is formed around the magnetostrictive rod 11c. The coils 12c is made from copper wire, for example, and the coil has about 250 turns. As described above, since the magnetic flux within the coil 12c is changed by the change in magnetic flux density through the expansion and contraction of the magnetostrictive rod 11c, current is produced in the coil 12c. With this, power can be generated. It should be noted that by changing the number of turns of the coil 12c as similarly to Embodiment 1, the size of voltage produced by the power generation element can be adjusted. Moreover, the number of turns of coil may be set at the above described level and may be changed where appropriate.

Different from the power generation element 1 according to Embodiment, the power generation element according to the present embodiment can generate power even when there is only one magnetostrictive rod. Moreover, by introducing the configuration of the connecting yoke 10c that combines, into a single entity, the two connecting yokes 10a and 10b and the magnetostrictive rod 11b in the power generation element 1, the number of components for the power generation element can be reduced and the connecting portion between the rigid rod and the connecting yoke can be reduced. With this, the joint between the connecting yokes and the magnetostrictive rod can be further strengthened. Moreover, since the coil 12c is wound only around the magnetostrictive rod 11c and the number of turns of coil can be increased, power generation capacity can be increased.

Embodiment 3

Next, Embodiment 3 according to an aspect of the present invention will be described. The present embodiment will describe a power generation element in which coils are wound in parallel around each of the magnetostrictive rods. FIGS. 12A to 12D are each a top view of the power generation element according to the present embodiment. FIGS. 13A to 13G are each an equivalent electrical circuit for a corresponding one of the power generation elements shown in FIGS. 12A to 12D. It should be noted that in FIGS. 12A to 12D, the coils 12a and 12b are shown as cross sectional views.

Figure 12A:
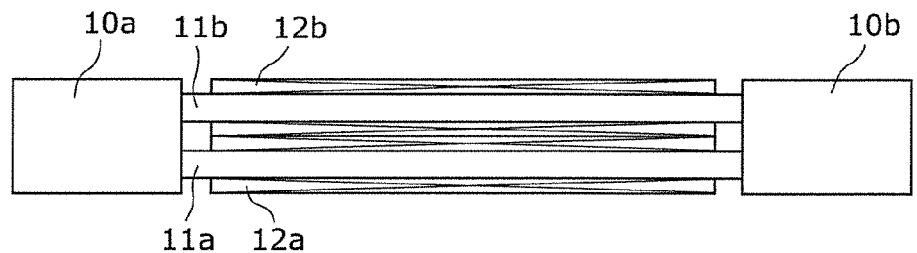
FIG. 12A is a top view of a power generation element according to Embodiment 3.

The power generation element 1 shown in FIG. 12A has the same configuration as the power generation element 1 shown in FIG. 1A, and shows the basic configuration of the power generation element 1. In the power generation element 1, the coil 12a is wound around the magnetostrictive rod 11a and the coil 12b is wound around the magnetostrictive rod 11b. With this configuration, by dividing the coil and then connecting the divided coils in parallel, load resistance and internal load resistance can be reduced for the power generation element 1.

Figure 13A:
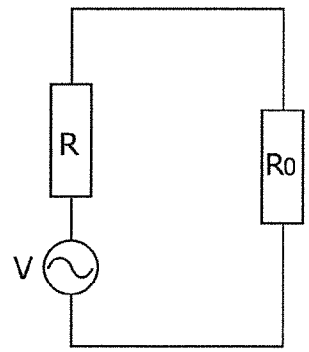
FIG. 13A is an equivalent electrical circuit diagram of the power generation element shown in FIG. 12A.

FIG. 13A is an equivalent electrical diagram of the power generation element 1. In FIG. 13A, given that the number of turns is N each for the coils 12a and 12b, the load resistance is R, the generated voltage is V, the external load resistance is $R_O$, the voltage produced by the load resistance $R_O$ is $V^2/4R_O$ when a matching condition is $R_O=R$ for taking out the maximum voltage.

Figure 12B:
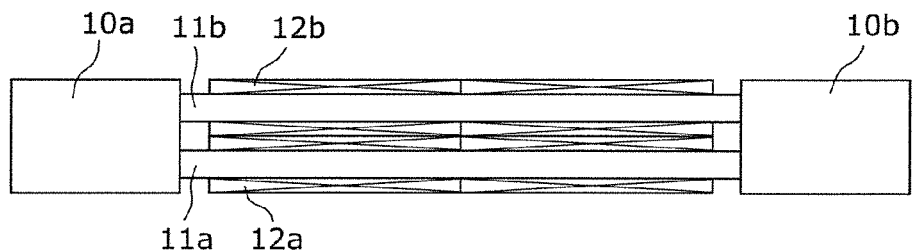
FIG. 12B is a top view of a power generation element according to Embodiment 3.
Figure 12C:
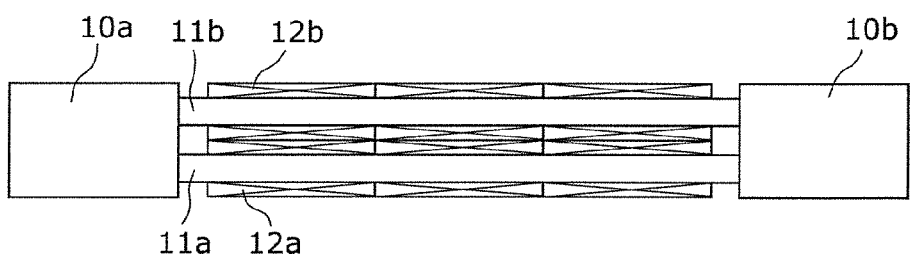
FIG. 12C is a top view of a power generation element according to Embodiment 3.
Figure 12D:
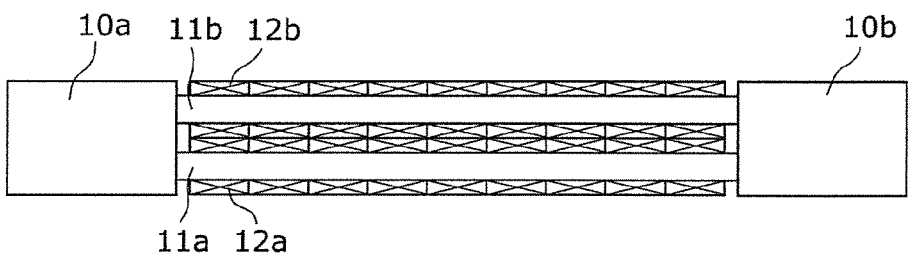
FIG. 12D is a top view of a power generation element according to Embodiment 3.
Figure 13B:
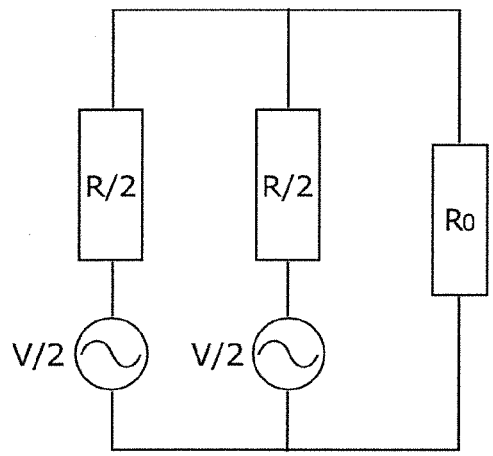
FIG. 13B is an equivalent electrical circuit diagram of the power generation element shown in FIG. 12B.
Figure 13C:
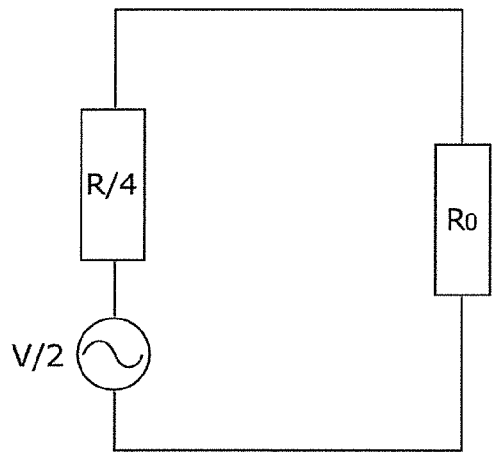
FIG. 13C is an equivalent electrical circuit diagram of the power generation element shown in FIG. 12B.
Figure 13D:
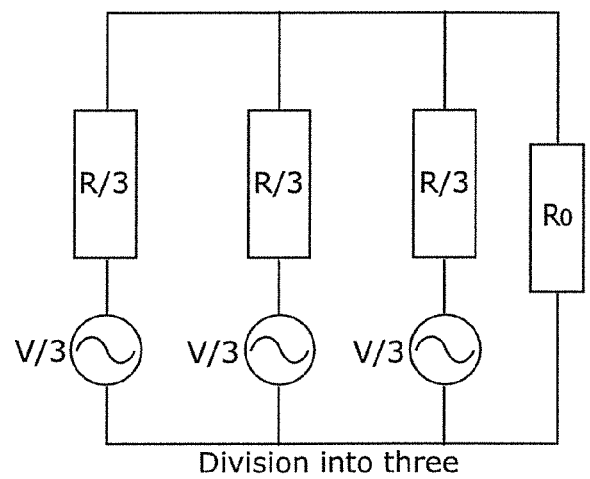
FIG. 13D is an equivalent electrical circuit diagram of the power generation element shown in FIG. 12C.
Figure 13E:
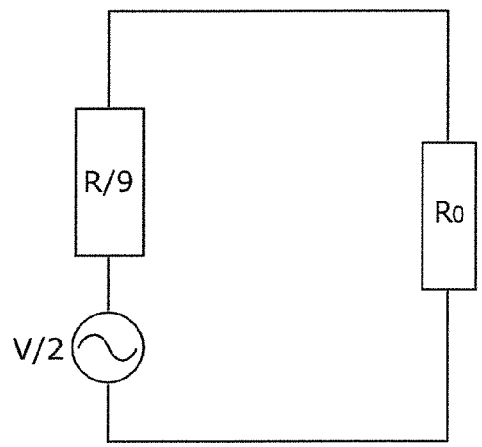
FIG. 13E is an equivalent electrical circuit diagram of the power generation element shown in FIG. 12C.
Figure 13F:
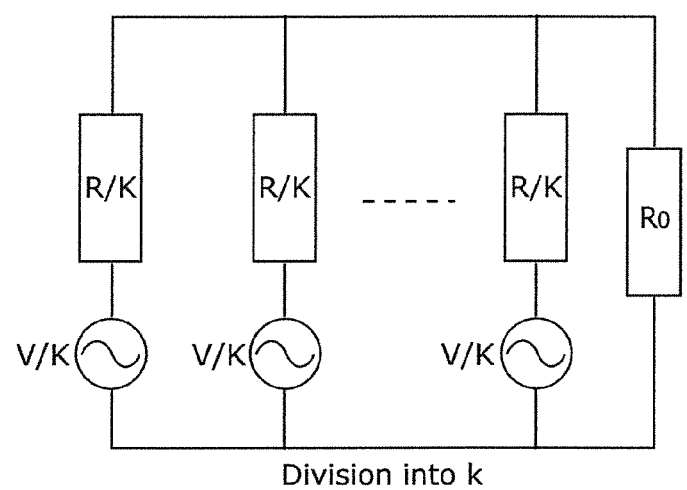
FIG. 13F is an equivalent electrical circuit diagram of the power generation element shown in FIG. 12D.
Figure 13G:
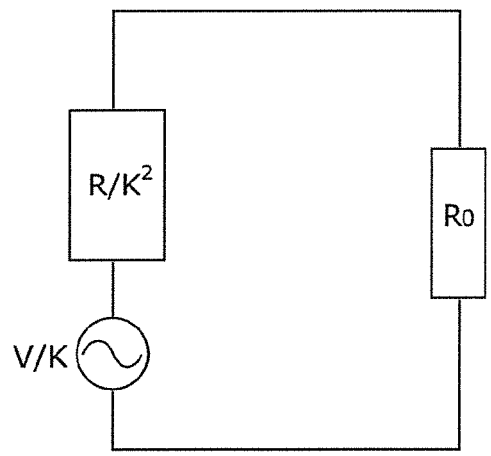
FIG. 13G is an equivalent electrical circuit diagram of the power generation element shown in FIG. 12D.

Moreover, given that the number of turns is N each for the coils 12a (or 12b) and the load resistance is R, the load resistance for each of the divided coils 12a (or 12b) is R/K as shown in the equivalent electrical circuit diagram of FIG. 13F when the coil 12a (or 12b) is divided into K coils as shown in FIG. 12D. Combined resistance R when all the K divided coils 12a (or 12B) are connected in parallel is $R=R/K^2$ as shown in FIG. 13G.

More specifically, as shown in FIG. 12B, when the two divided coils 12a (or 12b) are connected in parallel, the load resistance for each of the two divided coils 12a (or 12b) is R/2 as shown in the equivalent electrical circuit diagram of FIG. 13B and the combined resistance is R/4 as shown in FIG. 13C. More specifically, as shown in FIG. 12C, when the three divided coils 12a (or 12b) are connected in parallel, the load resistance for each of the three divided coils 12a (or 12b) is R/3 as shown in the equivalent electrical circuit diagram of FIG. 13D and the combined resistance is R/9 as shown in FIG. 13E.

Moreover, by increasing the number of turns N for each of the coils 12a (or 12b); the generated power can be increased. Since the generated voltage is proportional to the number of turns for the coil 12a (or 12b), the number of turns for each of the K divided coils 12a (or 12b) is N/K and the generated voltage is 1/K times as shown in FIG. 13D. For example, as shown in FIG. 13B, when the coil 12a (or 12b) is divided into two, the generated voltage is V/2. Moreover, as shown in FIG. 13D, when the coil 12a (or 12b) is divided into three, the generated voltage is V/3.

The generated power under a matching condition in which the external load resistance R is $R/K^2$, the generated power is $(V/K)^2/(4R/K^2)=V^2/4R$ and the same as the generated voltage when the coil is not divided. In other words, by dividing the coil 12a (or 12b) into K and connecting the divided coils in parallel, the internal resistance of the power generation element 1 can be reduced to $1/K^2$ times (but the voltage is 1/K times). On the other hand, when the load resistance R which is the same as the load resistance when the coil is not divided is permitted, the load resistance may be set at $K^2$ times, that is, the number of turns may be set at $K^2$ times (assuming that the number of turns and the load resistance have a proportional relationship). In this case, the generated voltage is $1/K \times K^2 = K$ times.

Therefore, the taken-out voltage is $(KV)^2/4R = K^2 \times V^2/4R$, and electric power which is $K^2$ times the voltage $V^2/4R$ produced in the load resistance R can be taken out.

Embodiment 4

Next, Embodiment 4 according to an aspect of the present invention will be described. In the present embodiment, the power generation apparatus in which power generation elements are connected in series as shown in Embodiment 1 and the power generation apparatus in which power generation elements are connected in series as shown in Embodiment 2 will be described. FIG. 14 and FIGS. 15A to 15D are each a schematic configuration view of the power generation apparatus according to the present embodiment. It should be noted that in FIG. 14, the coils 12a and 12b are shown as cross sectional views.

Figure 14:
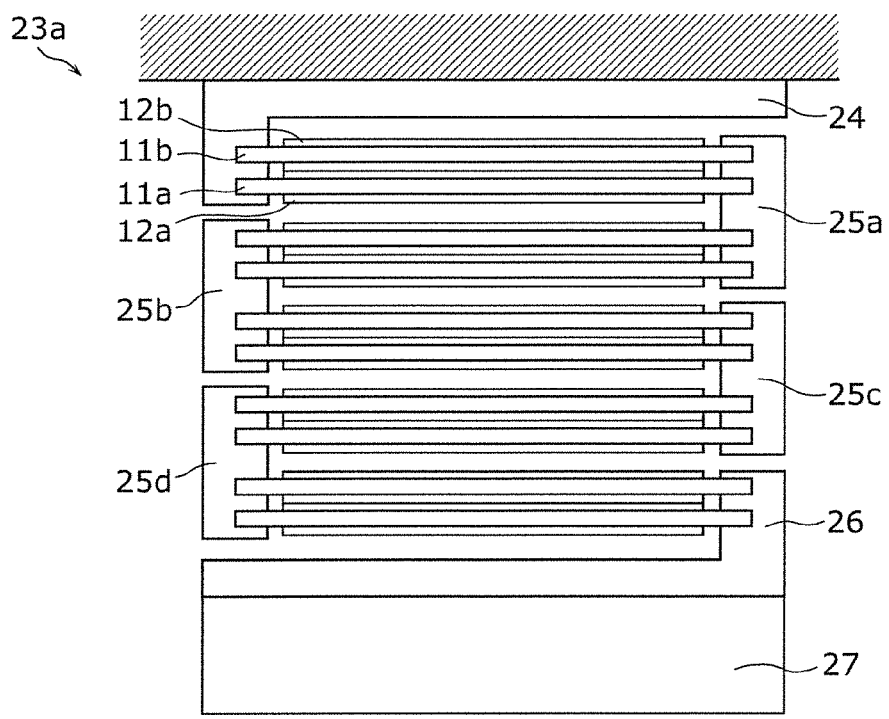
FIG. 14 is a skeletal framework of a power generation apparatus according to Embodiment 4.

FIG. 14 is a schematic configuration view of the power generation apparatus in which power generation elements according to Embodiment 1 are connected in series. As shown in FIG. 14, a power generation apparatus 23a includes a fixing unit 24, five power generation elements connected in series to the fixing unit 24, a fixing unit 26, and a weight (mover) 27. Each of the power generation elements connected in series includes the magnetostrictive rods 11a and 11b, the coils 12a which is wound around the magnetostrictive rod 11a and the coil 12b which is wound around the magnetostrictive rod 11b, and the connecting yokes 25a, 25b, 25c, and 25d which are connected to the magnetostrictive rods 11a and 11b. The five power generation elements are each disposed in parallel, the power generation elements adjacent to each other share the connecting yokes, and the five power generation elements are connected in series.

In other words, as shown in FIG. 14, the other ends of the magnetostrictive rods 11a and 11b of the first power generation element having one ends which are connected to the fixing unit 24 are connected to the connecting yoke 25a, and one ends of the magnetostrictive rods 11a and 11b of the second power generation element disposed in parallel with the first power generation element are connected to the connecting yoke 25a. The other ends of the magnetostrictive rods 11a and 11b of the second power generation element are connected to the connecting yoke 25b, and one ends of the magnetostrictive rods 11a and 11b of the third power generation element disposed in parallel with the second power generation element are connected to the connecting yoke 25b. The other ends of the magnetostrictive rods 11a and 11b of the third power generation element are connected to the connecting yoke 25c, and one ends of the magnetostrictive rods 11a and 11b of the fourth power generation element disposed in parallel with the third power generation element are connected to the connecting yoke 25c. The other ends of the magnetostrictive rods 11a and 11b of the fourth power generation element are connected to the connecting yoke 25d, and one ends of the magnetostrictive rods 11a and 11b of the fifth power generation element disposed in parallel with the fourth power generation element are connected to the connecting yoke 25d. The other ends of the magnetostrictive rods 11a and 11b of the fifth power generation element are connected to the fixing unit 26. With this configuration, since the whole shape of the power generation apparatus 23a is a spring having elasticity, one of the magnetostrictive rods 11a and 11b for each of the power generation elements expands and the other contracts due to the vertical vibration of the weight 27. With this, it is possible for the power generation element according to the present embodiment to generate power as similarly to the power generation element 1 according to Embodiment 1.

According to the configuration of the power generation apparatus 23a, when the mutually adjacent power generation elements share the connecting yoke which joins the magnetostrictive rods of the power generation elements and the power generation elements are connected in series, power generation capacity can be greater. More specifically, the serial connection of K power generation elements can help increase power generation capacity by K times. At the same time, since the resonance frequency can be reduced to 1/K by arranging K power generation elements in parallel, the number of vibrations per unit time can be increased and power generation capacity can be increased. Since the whole shape of the power generation apparatus has a spring having elasticity, the vibration by the power generation element can continue for a long time. With this, the number of vibrations and power generation that are suitable in use environment can be easily adjusted. It should be noted that an effect can be obtained that power generation capacity is greater when the weight of the weight 27 is increased.

Figure 15A:
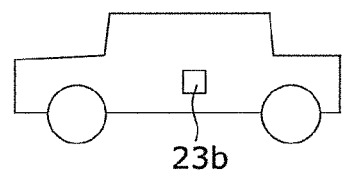
FIG. 15A is a diagram showing an example in which the power generation apparatus is used according to Embodiment 4 is used.

FIG. 15A is a diagram showing an example in which the power generation apparatus is used. As shown in FIG. 15A, the power generation apparatus 23a or a power generation apparatus 23b to be shown later may be installed in the body of a vehicle, for example.

Figure 15B:
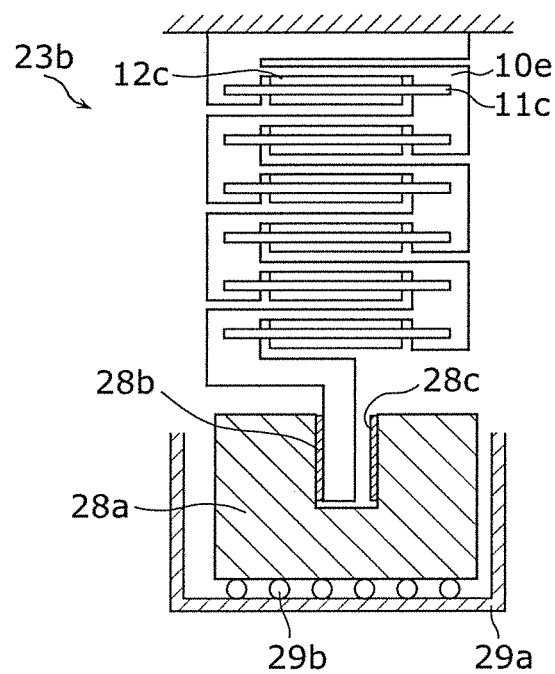
FIG. 15B is a skeletal framework of the power generation apparatus shown in FIG. 15A.
Figure 15C:
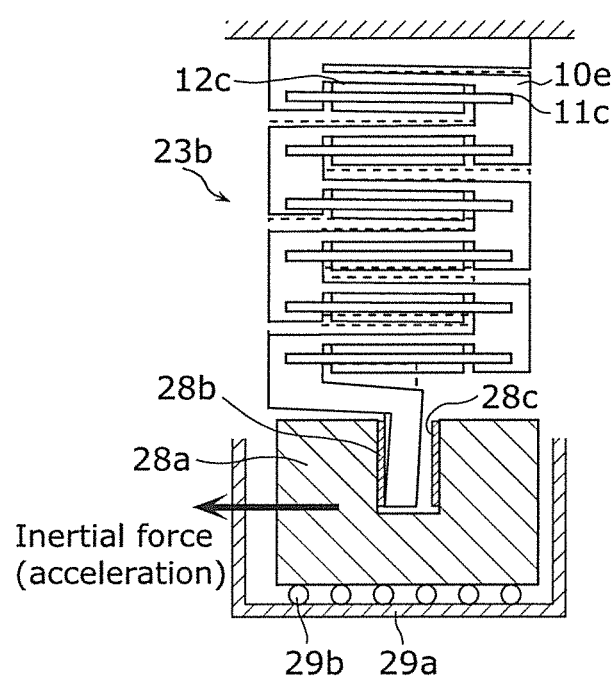
FIG. 15C is a skeletal framework of the power generation apparatus shown in FIG. 15A.
Figure 15D:
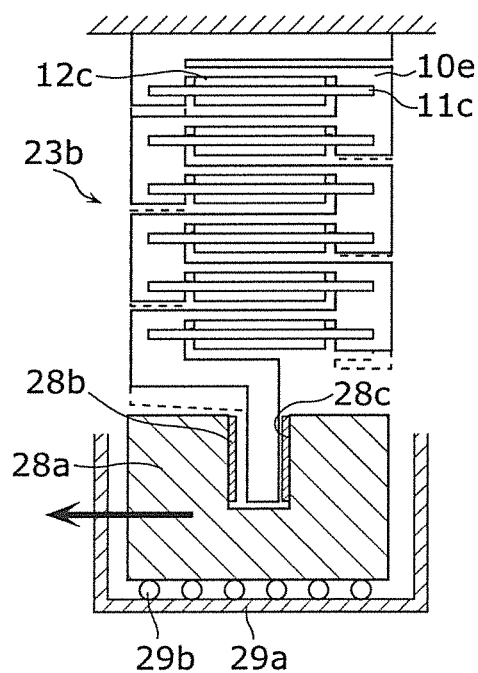
FIG. 15D is a skeletal framework of the power generation apparatus shown in FIG. 15A.

FIGS. 15B to 15D are each a schematic configuration view of the power generation apparatus in which power generation elements according to Embodiment 2 are connected in series. In FIGS. 15B to 15D, the coil 12c is shown as a cross sectional view.

The configuration of the power generation apparatus 23b shown in FIGS. 15B to 15D is almost the same as the configuration of the above described power generation apparatus 23a. The difference from the power generation apparatus 23a is that each of the power generation elements of the power generation apparatus 23b comprises a nnagnetostrictive rod 11c, a connecting yoke 10e, and a coil 12c which is wound around the nnagnetostrictive rod 11c.

As shown in FIGS. 15B to 15D, the power generation apparatus 23b includes a power generation element connecting body in which power generation elements are connected in series, a weight 28a, magnets 28b and 28c each of which is provided a sidewall of the concave portion formed in the weight 28a, a container 29a which houses the weight 28a, and spheres 29b which are provided between the weight 28a and the container 29a. The spheres 29b are provided for reducing friction between the weight 28a and the container 29a.

As shown in FIGS. 15B to 15D, part of the power generation element connecting body is inserted into the concave portion formed in the weight 28a. The magnets 28b and 28c provided on the concave portion are disposed in an axis direction of the nnagnetostrictive rod 11c. In other words, each of the magnets 28b and 28c is disposed in a direction in which part of the power generation element connecting body which is inserted into the concave portion vibrates. Since the part of the power generation element connecting body has magnetism because it is formed to be combined with the connecting yoke 10e formed with a magnetic body, the part of the power generation element connecting body is absorbed on the surface for each of magnets 28b and 28c.

Hereafter, the operation of the power generation apparatus 23b will be described. The power generation apparatus 23b, for example, is installed on a vehicle and has a configuration of vibrating using inertial force of the vehicle. Here, the inertial force is force caused by a rate of acceleration when the vehicle starts (acceleration) or stops (slowdown).

When the vehicle is in normal operation, that is, runs at constant speed, the weight 28a and part of the power generation element connecting body come together due to the absorption force of the magnet 28b as shown in FIG. 15B. Moreover, when the vehicle reduces speed due to brake application and slowdown, inertial force which tries to move the vehicle forward further in a traveling direction is applied to the weight 28a. With this, as shown in FIG. 15C, the power generation element connecting body which is unified with the magnet 28b due to the absorption force of the magnet 28b is deformed. Since each one of the magnetostrictive rods 11c or one end for each of the connecting yokes 10e for the power generation elements expand and the other contracts during the deformation, the magnetic flux of the magnetostrictive rod 11c is changed and current is produced in the coil 12c. With this, power can be generated. It should be noted that since the weight 28a is disposed within the container 29a and on the sphere 29b, the weight 28a can move within the container 29a and the container 29a serves as a stopper and displacement is restricted.

Moreover, as shown in FIG. 15C, the weight 28a moves due to inertial force and the inertial force exceeds the absorption force of the magnet 28b, the weight 28a is detached from the part of the power generation element connecting body. At this time, the acting force by the inertial force is zero and free vibration is excited at the power generation element connecting body. Since, with this vibration, one for each of the magnetostrictive rods 11c and one side for each of the connecting yokes 10e for the power generation elements that comprise the power generation apparatus 23b expand and the others contract, power generation can be realized as similarly to the case shown in FIG. 15B.

Moreover, as shown in FIG. 15D, after the weight 28a is detached from the magnet 28b, the part of the power generation element connecting body is absorbed onto the surface of the magnet 28c provided on a sidewall on the opposite side of the sidewall in the concave portion in which the magnet 28b is disposed. With this, power generation can be performed as similarly to the power generation at the time of opposite acceleration rate (start or acceleration of the vehicle).

It should be noted that in the above described power generation apparatus 23b, the power generation element connecting body is used in which a plurality of power generation elements are connected to each other for reducing the resonance frequency and necessary force in the whole of the power generation apparatus. However, in the power generation apparatus using inertial force, power generation is possible without depending on the above described power generation element connecting body. Moreover, power can be generated with not only inertial force but also vertical vibration.

Embodiment 5

Next, Embodiment 5 according to an aspect of the present invention will be described. In the present embodiment, a mobile phone will be described as an example of the electronic device including the power generation element as described in Embodiment 1.

Figure 16:
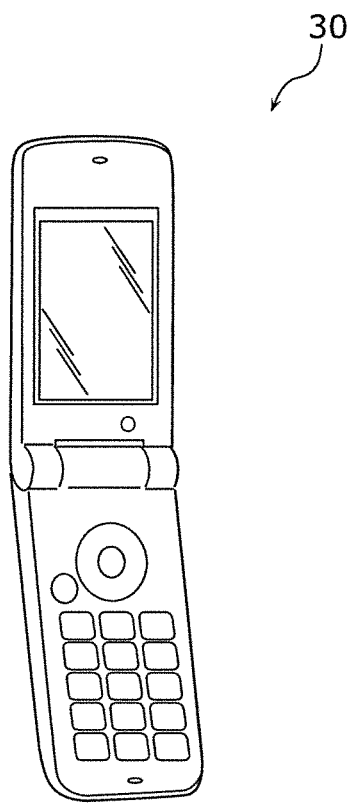
FIG. 16 is a skeletal framework of a mobile phone according to Embodiment 5.
Figure 17:
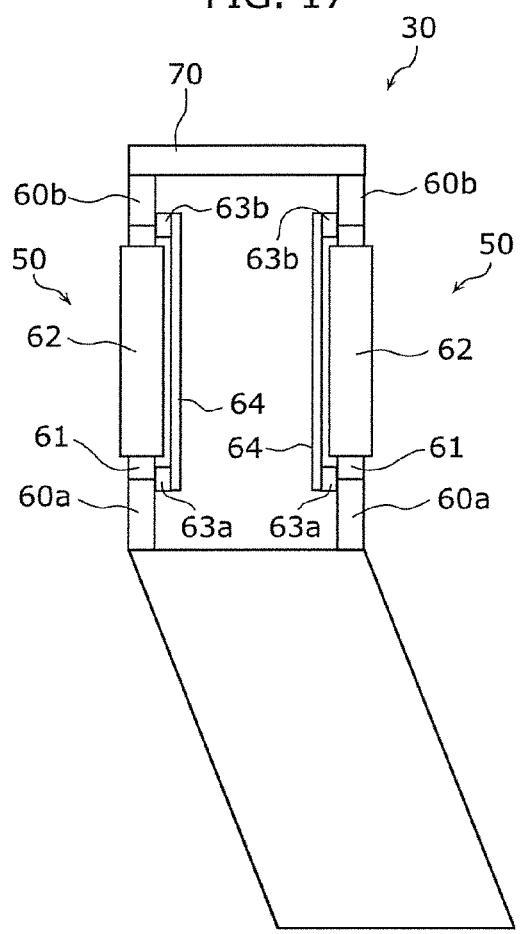
FIG. 17 is a schematic view of part of an internal structure of the mobile phone shown in FIG. 16.

FIG. 16 is a schematic configuration view of the mobile phone according to the present embodiment. FIG. 17 is a diagram showing part of the internal structure of the mobile phone shown in FIG. 16 and a diagram showing a portion in which the power generation element is included.

As shown in FIG. 17, each one of the power generation elements 50 is installed, in the inside of the lid portion in which the display of the mobile phone 30 is included, on both sides of the location in which the display is disposed. Each of the power generation elements 50, as similarly to the power generation element 1 shown in Embodiment 1, includes connecting yokes 60a and 60b, a magnetostrictive rod 61, permanent magnets 63a and 63b, and a back yoke 64.

As shown in FIG. 17, in each of the power generation elements 50, the connecting yoke 60a is disposed on the side of axis that is the central axis for opening and closing the lid portion of the mobile phone 30, and the connecting yoke 60b is disposed at the end side of the mobile phone 30. Moreover, the back yoke 64 of the power generation element 50 is disposed further toward the side of the center of the lid portion of the mobile phone 30 compared with the magnetostrictive rod 61. Moreover, at the end side of the mobile phone 30, a weight 70 is provided for connecting the connecting yokes 60b of the two power generation elements 50.

With this configuration, by opening and closing of the lid portion of the mobile phone 30, the magnetostrictive rod 61 provided in the power generation element 50 expands and contracts due to vibration of the magnetostrictive rod 61. Power is generated by a change in the magnetic flux through the coil 62 that is caused by the expansion and contraction.

It should be noted that the configuration of the mobile phone 30 including the power generation element 50 shown in FIG. 17 is a mere example for implementing the present invention in the mobile phone. It is acceptable for a configuration to include a resonance vibration generating mechanism which generates vibration other than the power generation element 50, for example.

Embodiment 6

Figure 18A:
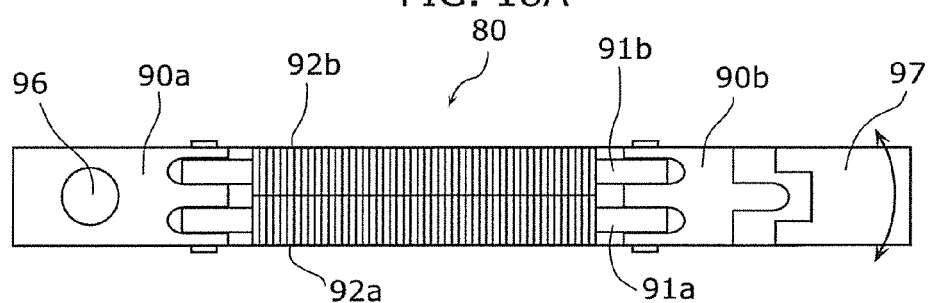
FIG. 18A is a top view of a power generation element according to Embodiment 6.
Figure 18B:
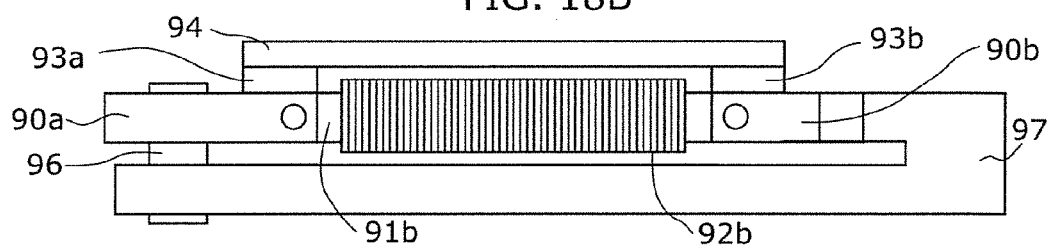
FIG. 18B is a side view of a power generation element according to Embodiment 6.
Figure 18C:
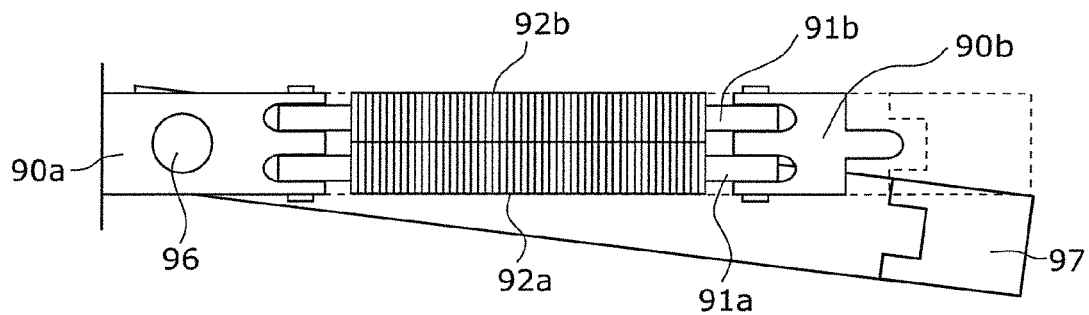
FIG. 18C is a top view showing an operation of a power generation element according to Embodiment 6.

Next, Embodiment 6 according to an aspect of the present invention will be described. In the present embodiment, the power generation element described in Embodiment 1 which includes the resonance vibration generating mechanism will be described. FIG. 18A is a top view of the power generation element including a flip mover as a resonance vibration generating mechanism. FIG. 18B is a side view of the power generation element according to the present embodiment. FIG. 18C is a top view of an operation of the power generation element according to the present embodiment.

A power generation element 80 shown in FIGS. 18A to 18C, as similarly to the above described power generation element 50, includes connecting yokes 90a and 90b, magnetostrictive rods 91a and 91b, coils 92a and 92b, permanent magnets 93a and 93b, and a back yoke 94. Moreover, a shaft 96 is provided in the connecting yoke 90a, and is configured in almost an L shape on the opposite side of the side on which the back yoke 94 is provided on the magnetostrictive rods 91a and 91b in a direction from the connecting yoke 90b to the connecting yoke 90a. It should be noted that in FIG. 18C, the back yoke 94 and the permanent magnets 93a and 93b are not illustrated.

Moreover, as shown in FIG. 18A, the connecting yoke 90b has a convex portion, and a flip mover 97 is provided with a concave portion corresponding to the convex portion. Then, the flip mover 97 on the side of the connecting yoke 90b is moved by designating the shaft 96 as a rotating shaft as shown in FIG. 18C, the concave portion of the flip mover 97 is in contact with and is hooked into the convex portion of the connecting yoke 90b, and then the convex portion of the connecting yoke 90b is flipped by the concave portion of the flip mover 97. With this, the power generation element 80 performs resonance vibration in a direction parallel with the magnetostrictive rods 91*a* and 91*b*.

In other words, by the shift of the flip mover 97 by designating the shaft 96 as a rotating shaft, the power generation element 80, in the connecting yoke 90*b*, receives force in a direction perpendicular to the axis direction of the magnetostrictive rods 91*a* and 91*b* along with the shift of the flip mover 97. With this, one of the magnetostrictive rods 91*a* and 91*b* expands and the other contracts, and then power is generated. Moreover, once the flip mover 97 is moved, the resonance vibration of the power generation element 80 occurs continuously and power can be continuously generated.

The power generation element 80 can supply power necessary for the electronic device continuously by fixing the end face of the side of the connecting yoke 90*a* provided with the shaft 96 to part of the human body, for example, and by mounting, as a weight, the flip mover 97 on the electronic device such as a mobile phone.

It should be noted that the power generation element 80 including the above described flip mover 97 provides a configuration in which the convex portion of the connecting yoke 90*b* is flipped by the concave portion of the flip mover 97. In addition to the configuration, a configuration in which the connecting yoke and the flip mover generate vibration using the attachment of the magnet, as similarly to the configuration of the part of the power generation element connecting body and the magnet 28*b* shown in Embodiment 4.

Embodiment 7

Next, Embodiment 7 according to an aspect of the present invention will be described. In the present embodiment, an air pressure sensor for monitoring air pressure in tire of vehicle and others, and a power generation apparatus on a road or a bridge will be described as an example of the electronic device including the power generation element as described in Embodiment 1.

Figure 19:
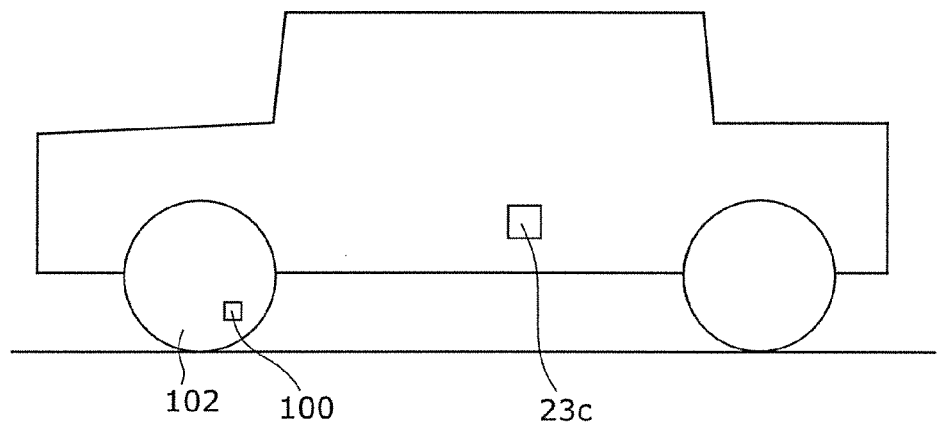
FIG. 19 is a diagram showing an application of a power generation element according to Embodiment 7.

As shown in Embodiment 4, a power generation apparatus 23*c* installed on the body of the vehicle shown in FIG. 19 is a power generation element which generates power with inertial force caused by vibration of the vehicle body and acceleration. The power generation element according to the present embodiment is disposed in an air pressure sensor 100 of a tire 102 as shown in FIG. 19. The air pressure sensor is generally installed on the tire which is rolling along with the travel of the vehicle, and therefore it is difficult for power necessary for the air pressure sensor to be supplied via wire with necessary power from the vehicle. Therefore, it is usually necessary for the air pressure sensor to include a miniaturized power source such as a button cell. By installing the power generation element according to Embodiment 1 on the air pressure sensor, power can be generated using the vibration of tire.

Figure 20:
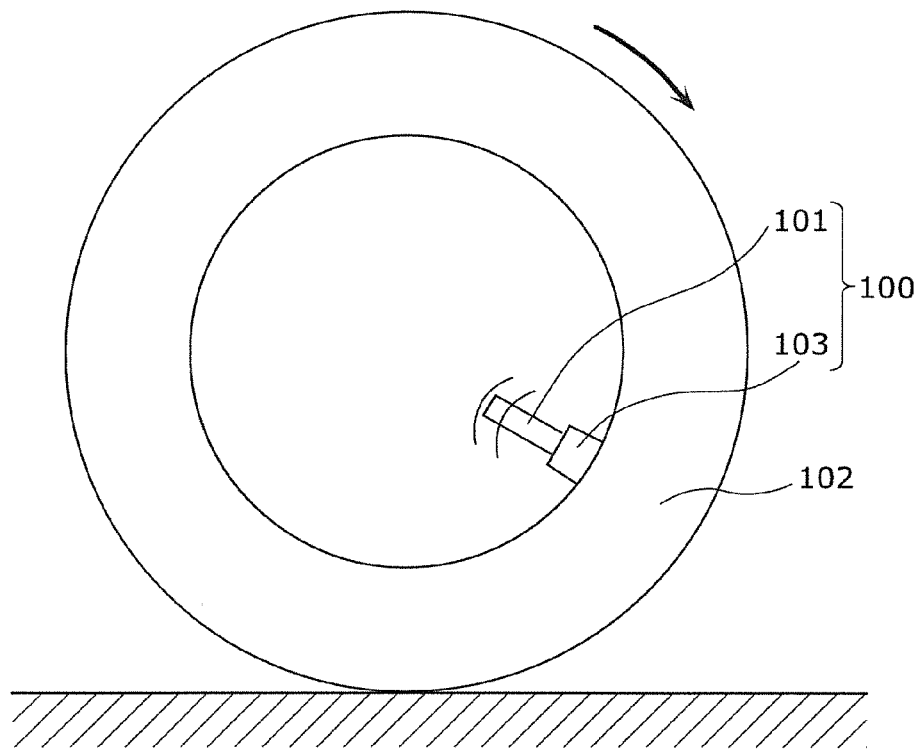
FIG. 20 is a schematic view for describing an air pressure sensor according to Embodiment 7.

FIG. 20 is a schematic view for describing an air pressure sensor 100 according to the present embodiment. As shown in FIG. 20, the air pressure sensor 100 includes a sensor unit 103 and a power generation element 101. Part of the sensor unit 103 is provided to be in contact with a tire 102. Moreover, in the power generation element 101, one end of the connecting yoke is fixed at the sensor unit 103, and the other end of the connecting yoke provided with a weight is disposed in a direction toward the inside of the radius of the tire. Then, the vibration of the tire 102 causes the power generation element 101 to vibrate and power is generated. Details of the operation of power generation are similar to the power generation element 50 shown in Embodiment 1. Therefore, the description will be omitted thereof. It should be noted that the vibration frequency of the tire is from 400 Hz to 500 Hz, for example.

Figure 21:
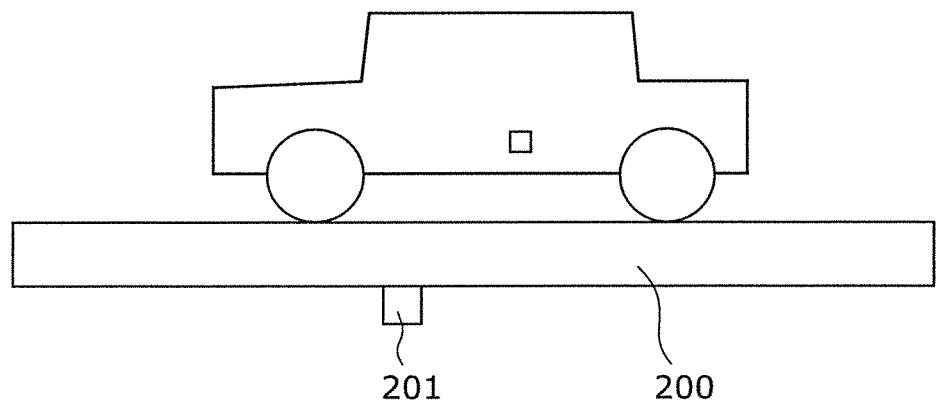
FIG. 21 is a schematic view for describing a vibration sensor according to Embodiment 7.

Moreover, FIG. 21 is an example of the power generation apparatus installed on a bridge or a road. On a bridge or a road 200, every time a vehicle and a pedestrian pass, vibration occurs. Therefore, by setting a power generation apparatus 201 on the bridge or the road, power can be generated by the power generation apparatus 201 using the vibration. A configuration is also acceptable in which the concave and convex portions are provided on the road surface and forced vibration occurs every time a vehicle and a pedestrian pass on the concave and convex portions of the road surface. Power generated by the power generation apparatus 201 may, for example, be used for the vibration sensor installed on the bridge and power sources such as electrical bulletin board and light emitting diodes for illumination.

The disposition location of the power generation apparatus 201, as shown in FIG. 21, may be under the road surface and other locations where vibration is easy to occur. Moreover, in addition to the bridge and road, a power generation apparatus may be disposed in the vicinity of a motor, a machine, and so on in a plant facility such as a manufacturing plant, and then power may be generated using vibration of the motor, the machine, and so on. Moreover, the power generation element may be the power generation element according to Embodiments 1 and 2, as well as Embodiment 4.

Moreover, since the power generation apparatus does not require wiring from power source, it is effective as power source for a wireless device. For example, in a plant facility, it is possible to be used as a power generation apparatus for a wireless sensor network.

It should be noted that in the present embodiment, the air pressure sensor and the vibration sensor are described as examples of the electronic device. However, the power generation element may be included in other electronic devices than the air pressure sensor. For example, a configuration including the power generation element is possible as a mobile electronic device such as mobile phone and a music player, as well as an implant sensor, and a miniature power supply device.

Embodiment 8

Figure 22A:
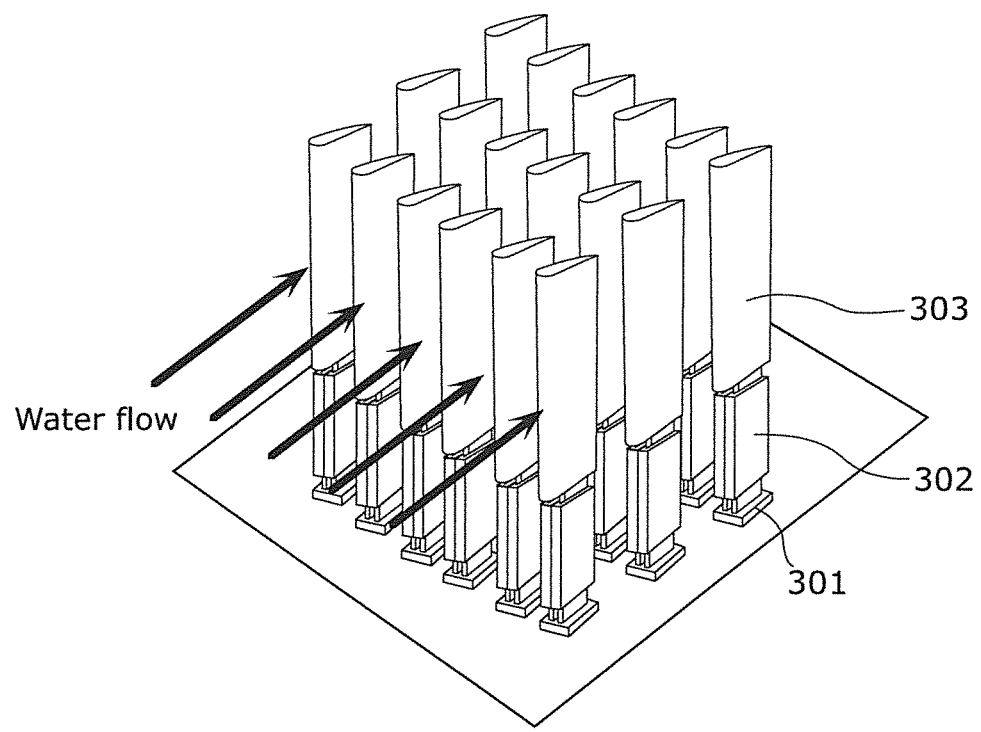
FIG. 22A is a diagram showing a power generation apparatus according to Embodiment 8.
Figure 22B:
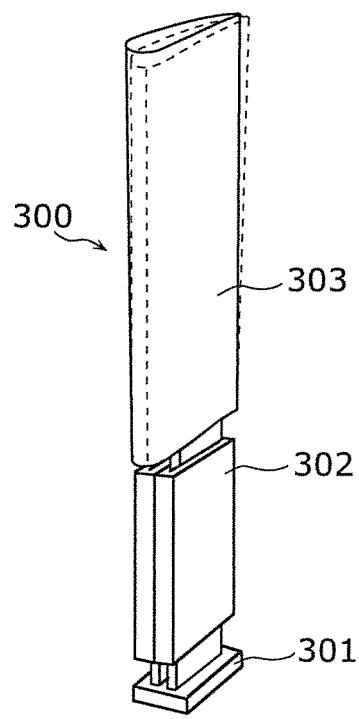
FIG. 22B is a diagram showing a power generation apparatus according to Embodiment 8.
Figure 22C:
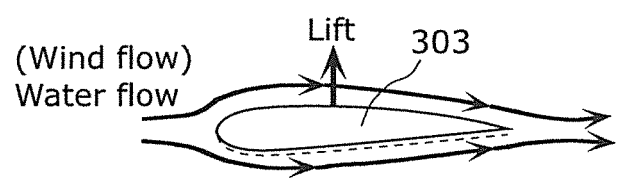
FIG. 22C is a diagram showing a power generation apparatus according to Embodiment 8.

Next, Embodiment 8 according to an aspect of the present invention will be described. In the present embodiment, a power generation system using vibration from water flow or wind flow will be described as an example of the power generation system including the power generation element as described in Embodiment 1. FIGS. 22A to 22C are each a diagram of the power generation apparatus according to the present embodiment.

As shown in FIGS. 22A and 22B, a power generation system according to the present embodiment includes a plurality of power generation apparatuses 300. The power generation apparatus 300 includes a fixing unit 301, a power generation element 302, and a wing shaped blade 303. In the power generation element 302, two plate shaped magnetostrictive materials (magnetostrictive plates) are disposed in parallel. One end for each of the magnetostrictive plates is fixed to the fixing unit 301, and the other end for each of the magnetostrictive plates is connected to the wing shaped blade 303. The wing shaped blade 303 is shaped in a plate-like form and the main surface of the wing shaped blade 303 is connected to the power generation element 302 to be disposed almost in the same direction of the main surfaces of the two magnetostrictive plates disposed in parallel with the power generation element 302. It should be noted that the fixing unit 301 corresponds to the connecting yoke according to the present invention, and the wing shaped blade 303 corresponds to the connecting yoke and the weight according to the present invention.

FIG. 22C is a top view of the wing shaped wind blade 303. As shown in FIG. 22C, in the wing shaped blade 303, the thickness of the wing shaped blade 303 is smaller in a direction from a side of a wide plane of a plate-like shape to the other side facing the side. With this configuration, a wing flow is generated from a portion with large plate thickness to a portion with small plate thickness of the wing shaped blade 303, and a difference in pressure caused by a difference in flowpath causes lift to be generated in the wing shaped blade 303. The lift and the operation of the elastic force of the wing shaped blade 303 and the power generation element 302 lead to the generation of self-induced vibration in the wing shaped blade 303 and the power generation element 302. Due to the vibration, one of the two magnetostrictive plates comprising the power generation element 302 expands and the other contracts. With this, since the magnetic flux of the magnetostrictive plate is changed and current is produced in the coil wound around the magnetostrictive plate (or the coil made of wiring printed on the magnetostrictive plate), power can be generated.

Power can be efficiently generated with a power generation system in which a plurality of the power generation apparatuses 300 having the above described configurations, as shown in FIG. 22A, are arranged in a uniform direction under water having constant water flow and in the air having constant wind flow.

It should be noted that in the above described power generation apparatus 300, the power generation element 302 comprises a plate shaped magnetostrictive material. However, as similarly to the power generation element 1 as shown in Embodiment 1, rod shaped magnetostrictive material may be used for forming the power generation element 302. Moreover, the wing shaped blade 303 is not limited to the above described configuration. Any configuration is acceptable as long as it is easy to generate lift and vibrate from water flow or wind flow. Furthermore, the magnetostrictive material comprising the power generation element 302 is not limited to a material comprising two magnetostrictive plates. A so-called unimorph structure is acceptable in which one magnetostrictive plate and a plate shaped material with different rigidity are glued together.

It should be noted that the present invention is not limited to the above described embodiments. Various modifications and transformations are possible without materially departing from the novel teachings of the present invention.

For example, in the above described embodiments, the cantilevered power generation element is described in which one of the ends of the connecting yoke is fixed and the other end is provided with the weight. Not only the cantilevered power generation element but also a configuration in which the central portion of the power generation element is fixed and each of the two connecting yokes is provided with the weight may be implemented. With this configuration, the weights disposed at both ends of the power generation element perform bending vibration at resonance frequency, and power can be continuously and efficiently generated. Moreover, a configuration is acceptable in which both ends of the power generation element are fixed and the weight is disposed at the central portion. With this configuration, the weight disposed at the central portion of the power generation element performs bending vibration at a predetermined resonance frequency, and power can be continuously and efficiently generated.

Moreover, in the above described embodiments, Galfenol which is an iron-gallium alloy is described as an example of a magnetostrictive material comprising the magnetostrictive rod. The magnetostrictive material may be not only Galfenol but also others. For example, permendur which is an iron-cobalt alloy and other materials are possible. Moreover, in order to magnify the change in magnetization with respect to tensile stress, a magnetostrictive material to which compression stress is added by stress anneal process in advance may be used.

Moreover, the shape of the magnetostrictive rod is not limited to a rod-shaped rectangular parallelepiped. For example, the shape of a rod-shaped column and other shapes are possible. Moreover, the size of the magnetostrictive rod is not limited to the above described examples, and may be changed. Moreover, the shape of the magnetostrictive rod is not limited to a rod-like shape. A plate-like shape, a magnetostrictive thin plate, and a magnetostrictive film are possible.

Moreover, the above described power generation element has a configuration including a back yoke having a permanent magnet. A configuration is also possible in which does not include the back yoke. Moreover, the shape of the back yoke is not limited to the above described shape. Other shapes are also possible.

Moreover, in the above described embodiments, a configuration is implemented in which resin is filled between coils formed around two magnetostrictive rods. It is not necessary for a configuration to have a unified coil. Moreover, the number of turns of coil is the same or different for each of the coils. Moreover, the coil does not have to be formed by being wound around the magnetostrictive rod. For example, the coil may be formed by a printed wiring pattern around the magnetostrictive rod.

Figure 23:
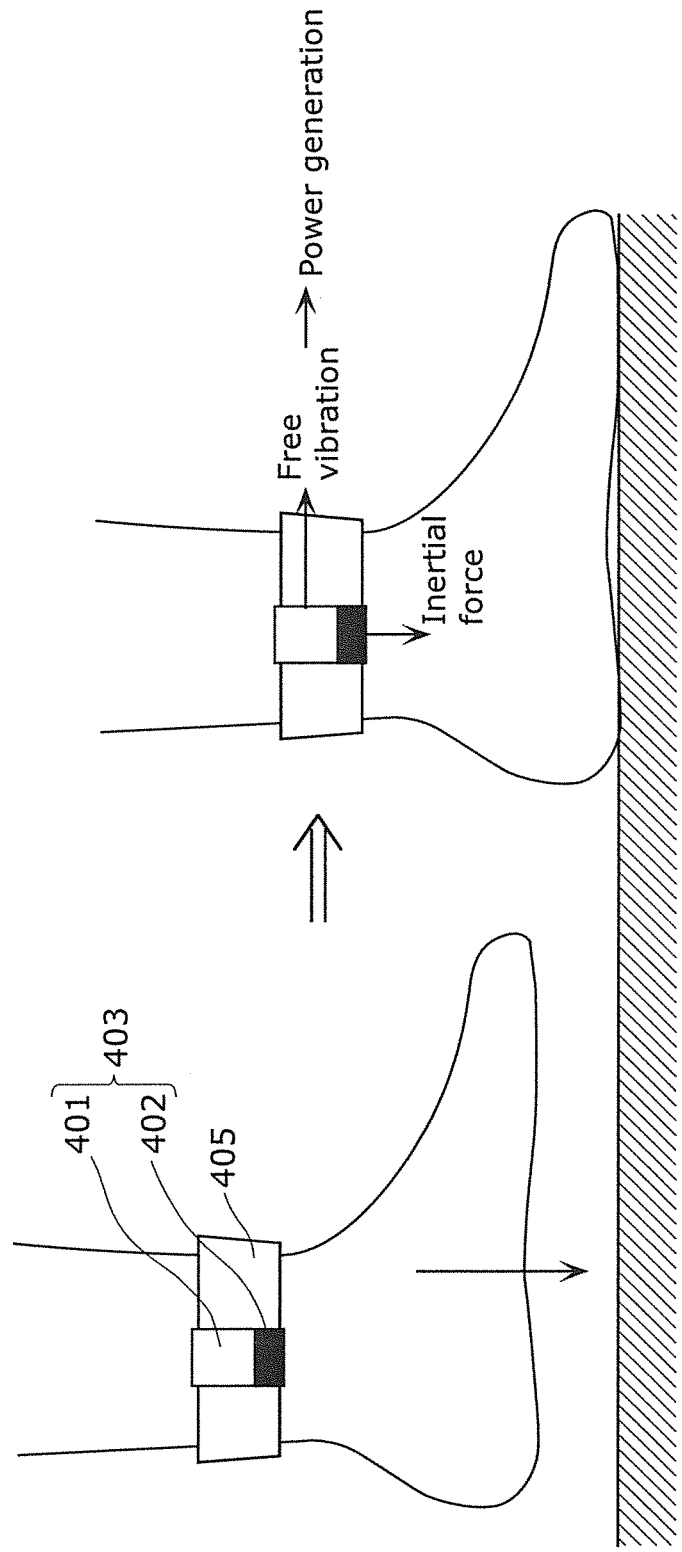
FIG. 23 is a diagram showing an example of an electronic device using a power generation element.

Moreover, the power generation element according to the present invention to an electronic device can be applied to not only the above described mobile phone and the air pressure sensor but also a wireless sensor used for a human and an animal as a vibration power generation element using vibration of walking by a human and an animal. More specifically, as shown in FIG. 23, a power generation device 403 in which an appropriate weight 402 is attached to a power generation element 401 is fixed to an ankle with an elastic band 405 made of an elastic body such as rubber. When a human lands the foot during walking, the speed suddenly becomes zero and large acceleration is generated, which causes the weight 402 to act large inertial force. With the inertial force, free vibration is induced by the connected power generation element 401, and power can be generated.

Furthermore, for example, by operating the Global Positioning System (GPS) included in the power generation device with electric power, the information of human position and animal behavior can be known. Generally, such a system requires a battery. By using the power generation element according to the present invention, however, it is possible for the system to be used almost permanently without depending on a battery. It should be noted that the position on which the above described power generation device 403 is attached may be not only ankle but also wrist and other body portions. The configuration can be applied to a power generation device for allowing a handicapped person who cannot move his or her fingers to express the intention, based on vibration by waving the portion on which the power generation device is attached or by banging the floor, the bed, or the like on which the power generation device is installed.

The power generation element according to the present invention includes another embodiment implemented by any combination of constituent elements in the embodiments, modifications obtained by modification in the embodiments without materially departing from the novel teachings of the present invention, and a variety of devices including the power generation element according to the present invention such as a mobile electronic device like a mobile phone and a music player, an implant sensor, and a miniature power supply device.

Although only some exemplary embodiments of the present invention have been described in detail above, those skilled in the art will readily appreciate that many modifications are possible in the exemplary embodiments without materially departing from the novel teachings and advantages of the present invention. Accordingly, all such modifications are intended to be included within the scope of the present invention.

The present invention can be effective as a device which generates vibration and the like, particularly a power generation element which is installed in a mobile phone and a music player which always generate vibration. Moreover, the present invention is also effective as the device installed on a location where vibration is generated, such as an LED light bulb and an electrical bulletin board for a bridge and a road. Furthermore, the present invention is effective for a power generation apparatus using water flow or wind flow. It can be used in a wide range of fields.

The invention claimed is:

1. A power generation element, comprising:
   a magnetostrictive rod made of a magnetostrictive material;
   a rigid rod made of a magnetic material other than a magnetostrictive material and disposed in parallel with the magnetostrictive rod, the magnetic material having rigidity and a shape that enable uniform application of a compression force or a tensile force to the magnetostrictive rod;
   a coil wound around the magnetostrictive rod; and
   two connecting yokes, each of which is provided at one end of each of the magnetostrictive rod and the rigid rod to connect the magnetostrictive rod and the rigid rod;
   wherein the power generation element generates power through expansion or contraction of the magnetostrictive rod due to vibration in a direction perpendicular to a longitudinal axis of the magnetostrictive rod.

2. The power generation element according to claim 1, further comprising
   a magnet comprising a back yoke.

3. The power generation element according to claim 1, wherein when the number of turns of the coil is N, the coil includes K coils connected in parallel and each comprising N/K turns.

4. The power generation element according to claim 1, wherein each of the two connecting yokes comprises two grooves, and
   respective ends of each of the magnetostrictive rod and the rigid rod are disposed in the two grooves of each of the two connecting yokes, and are fixed to the two connecting yokes.

5. The power generation element according to claim 1, wherein each of the two connecting yokes comprises two grooves,
   respective ends of each of the magnetostrictive rod and the rigid rod are disposed in the two grooves of each of the two connecting yokes, and each of the two connecting yokes comprises a portion compressed around a respective end of each of the magnetostrictive rod and the rigid rod.

6. A power generation element, comprising:
   a first magnetostrictive rod comprising a magnetostrictive material;
   a second magnetostrictive rod comprising a magnetic material and disposed in parallel with the first magnetostrictive rod, the magnetic material having rigidity and a shape that enable uniform application of a compression force or a tensile force to the first magnetostrictive rod;
   a first coil wound around the first magnetostrictive rod and a second coil wound around the second magnetostrictive rod; and
   two connecting yokes, each of which is provided at one end of each of the first and second magnetostrictive rods to connect the first and second magnetostrictive rods;
   wherein the power generation element generates power through expansion or contraction of the first magnetostrictive rod due to vibration in a direction perpendicular to a longitudinal axis of the first magnetostrictive rod; and
   connection interfaces between each of the two connecting yokes and each of the first and second magnetostrictive rods are reinforced with an adhesive.

7. The power generation element according to claim 6, further comprising
   a magnet comprising a back yoke.

8. A plurality of power generation elements wherein:
   at least one of the power generation elements comprises:
   a magnetostrictive rod comprising a magnetostrictive material;
   a rigid rod comprising a magnetic material and disposed in parallel with the magnetostrictive rod, the magnetic material having rigidity and a shape that enable uniform application of a compression force or a tensile force to the magnetostrictive rod;
   a coil wound around the magnetostrictive rod; and
   two connecting yokes, each of which is provided at one end of each of the magnetostrictive rod and the rigid rod to connect the magnetostrictive rod and the rigid rod;
   wherein the plurality of power generation elements is disposed in parallel, at least one of the power generation elements generates power through expansion or contraction of the magnetostrictive rod due to vibration in a direction perpendicular to a longitudinal axis of the magnetostrictive rod, and
   the plurality of power generation elements is connected in series.

9. A power generation element, comprising:
   a magnetostrictive rod comprising a magnetostrictive material;
   a rigid rod comprising a magnetic material and disposed in parallel with the magnetostrictive rod, the magnetic material having rigidity and a shape that enable uniform application of a compression force or a tensile force to the magnetostrictive rod;
   a coil wound around the magnetostrictive rod; and
   two connecting yokes, each of which is provided at one end of each of the magnetostrictive rod and the rigid rod to connect the magnetostrictive rod and the rigid rod;
   wherein the rigid rod and the two connecting yokes are formed into a single entity, and
   the power generation element generates power through expansion or contraction of the magnetostrictive rod due to vibration in a direction perpendicular to a longitudinal axis of the magnetostrictive rod.

10. A power generation element, comprising:
    a first magnetostrictive rod comprising a magnetostrictive material;

a second magnetostrictive rod comprising a magnetic material and disposed in parallel with the magnetostrictive rod, the magnetic material having rigidity and a shape that enable uniform application of a compression force or a tensile force to the first magnetostrictive rod;

a first coil wound around the first magnetostrictive rod and a second coil wound around the second magnetostrictive rod; and two connecting yokes, each of which is provided at one end of each of the first and second magnetostrictive rods to connect the first and second magnetostrictive rods;

wherein the power generation element generates power through expansion or contraction of the first magnetostrictive rod due to vibration in a direction perpendicular to a longitudinal axis of the first magnetostrictive rod; and each of the ends of each of the first and second magnetostrictive rods comprises a pin, wherein the pin penetrates into a respective one of the connecting yokes and forms a joint.

11. A power generation element, comprising:

a first magnetostrictive rod comprising a magnetostrictive material;

a second magnetostrictive rod comprising a magnetic material and disposed in parallel with the magnetostrictive rod, the magnetic material having rigidity and a shape that enable uniform application of a compression force or a tensile force to the first magnetostrictive rod;

a first coil wound around the first magnetostrictive rod and a second coil wound around the second magnetostrictive rod; and two connecting yokes, each of which is provided at one end of each of the first and second magnetostrictive rods to connect the first and second magnetostrictive rods;

wherein the power generation element generates power through expansion or contraction of the first magnetostrictive rod due to vibration in a direction perpendicular to a longitudinal axis of the first magnetostrictive rod; and each of the two connecting yokes comprises an end including a curved portion adjoining the first magnetostrictive rod or the second magnetostrictive rod, wherein the curved portion is configured to reduce a concentration of a stress at respective ends of each of the first magnetostrictive rod and the second magnetostrictive rod upon vibration.

* * * * *